US012749867B2

(12) United States Patent
Nishikawa

(10) Patent No.: US 12,749,867 B2
(45) Date of Patent: Sep. 29, 2026

(54) SEMICONDUCTOR LASER DEVICE

(71) Applicant: Nuvoton Technology Corporation Japan, Kyoto (JP)

(72) Inventor: Tohru Nishikawa, Toyama (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 843 days.

(21) Appl. No.: 18/064,012

(22) Filed: Dec. 9, 2022

(65) Prior Publication Data

US 2023/0104829 A1 Apr. 6, 2023

Related U.S. Application Data

(63) Continuation of application No. PCT/JP2021/021953, filed on Jun. 9, 2021.

(30) Foreign Application Priority Data

Jun. 22, 2020 (JP) ................................ 2020-106789

(51) Int. Cl.
*H01S 5/02* (2006.01)
*H01S 5/02315* (2021.01)
(Continued)

(52) U.S. Cl.
CPC ........ *H01S 5/0216* (2013.01); *H01S 5/02315* (2021.01); *H01S 5/0268* (2013.01)

(58) Field of Classification Search
CPC .. H01S 5/0216; H01S 5/02315; H01S 5/0237; H01S 5/02375; H01S 5/0234; H01S 5/02355; H01S 5/0236; H01S 5/0215
See application file for complete search history.

(56) References Cited

U.S. PATENT DOCUMENTS

2012/0068364 A1 3/2012 Mengel et al.
2012/0138665 A1 6/2012 Oka
(Continued)

FOREIGN PATENT DOCUMENTS

JP S58-201388 A 11/1983
JP 2003-347650 A 12/2003
(Continued)

OTHER PUBLICATIONS

International Search Report issued on Aug. 31, 2021 in International Patent Application No. PCT/JP2021/021953, with English translation.

*Primary Examiner* — Xinning (Tom) Niu
*Assistant Examiner* — Delma R Forde
(74) *Attorney, Agent, or Firm* — RIMON P.C.

(57) ABSTRACT

A semiconductor laser device includes a submount, a semiconductor laser element, and a bonding material. The semiconductor laser element includes a substrate and a layered structure, and is disposed with the layered structure facing the submount. A waveguide extending in a first direction parallel to the main surface of the substrate is formed in the layered structure. The bonding material includes an inner region bonded to the semiconductor laser element and one outer region located outward of the inner region. The one outer region is spaced apart from one side surface of the semiconductor laser element. Width A of the semiconductor laser element and width B of the one outer region in a second direction perpendicular to the first direction and parallel to the main surface of the substrate satisfy B≥A/4.

23 Claims, 12 Drawing Sheets

(51) Int. Cl.

| | |
|---|---|
| ***H01S 5/0237*** | (2021.01) |
| ***H01S 5/026*** | (2006.01) |

(56) References Cited

U.S. PATENT DOCUMENTS

| | | | |
|---|---|---|---|
| 2017/0077674 A1 | 3/2017 | Hagimoto et al. | |
| 2018/0278015 A1 | 9/2018 | Hagimoto et al. | |
| 2020/0067267 A1 * | 2/2020 | Takayama ............ | H01S 5/0233 |

FOREIGN PATENT DOCUMENTS

| | | |
|---|---|---|
| JP | 2009-059904 A | 3/2009 |
| JP | 2010-171047 A | 8/2010 |
| JP | 2012-119637 A | 6/2012 |
| JP | 2017-059620 A | 3/2017 |
| JP | 2018-164068 A | 10/2018 |
| WO | 2018/203466 A1 | 11/2018 |
| WO | 2019/163276 A1 | 8/2019 |
| WO | 2020/031589 A1 | 2/2020 |

* cited by examiner

SEMICONDUCTOR LASER DEVICE

CROSS REFERENCE TO RELATED APPLICATIONS

This is a continuation application of PCT International Application No. PCT/JP2021/021953 filed on Jun. 9, 2021, designating the United States of America, which is based on and claims priority of Japanese Patent Application No. 2020-106789 filed on Jun. 22, 2020. The entire disclosures of the above-identified applications, including the specifications, drawings, and claims are incorporated herein by reference in their entirety.

FIELD

The present disclosure relates to a semiconductor laser device and a method for manufacturing a semiconductor laser device.

BACKGROUND

In recent years, semiconductor laser elements have attracted attention as light sources for various applications, including light sources for image display devices such as displays and projectors, light sources for automotive headlamps, lights sources for industrial and consumer lighting, and light sources for industrial equipment such as laser welding devices, thin film annealing devices, and laser processing devices. Semiconductor laser elements used as light sources for the above applications are required to have high output power and high beam quality, with optical output power well in excess of 1 watt.

Since the higher output power of a semiconductor laser element generates more heat, a configuration in which the semiconductor laser element is mounted on a heat-dissipating component such as a submount with high thermal conductivity has been adopted (see, for example, Patent Literature (PTL) 1). In the semiconductor laser element described in PTL 1, a junction-down mounting method is employed in which, from among the n-type semiconductor layer laminated close to the substrate of the semiconductor laser element and the p-type semiconductor layer laminated far from the substrate, the p-type semiconductor layer side is mounted on the submount. This allows the active layer and the submount to be closer than when the substrate side of the semiconductor laser element is mounted on the submount, which improves heat dissipation characteristics.

When a semiconductor laser element is mounted junction-down to a heat-dissipating component such as a submount, bonding material such as solder that bonds the semiconductor laser element to the submount may adhere to side surfaces of the semiconductor laser element, causing a short between the p-type semiconductor layer and the n-type semiconductor layer. In the semiconductor laser device described in PTL 1, the end portion of the p-side electrode of the semiconductor laser element is positioned a predetermined distance inward from a side surface of the semiconductor laser element in order to inhibit bonding material from adhering to the side surface of the semiconductor laser element.

CITATION LIST

Patent Literature

PTL 1: Japanese Unexamined Patent Application Publication No. 2010-171047

SUMMARY

Technical Problem

As the output power of the semiconductor laser element increases, the size of the element also increases. In larger semiconductor laser elements, the bonding material tends to be thicker in order to ensure there is enough bonding surface area between the electrode and the bonding material. In the semiconductor laser device described in PTL 1 as well, the bonding material may leak out near the side surface of the semiconductor laser element and adhere to the side surface of the semiconductor laser element due to the thickening of the bonding material.

The present disclosure overcomes such a technical problem, and has an object to provide, for example, a semiconductor laser device that can inhibit bonding material from adhering to side surfaces of the semiconductor laser element.

Solution to Problem

In order to overcome the above-described technical problem, one aspect of the semiconductor laser device according to the present disclosure includes: a submount; a semiconductor laser element; and a bonding material that bonds the submount and the semiconductor laser element. The semiconductor laser element includes a substrate and a layered structure laminated above a main surface of the substrate, and is disposed with the layered structure facing the submount. The layered structure includes a first conductive semiconductor layer, an active layer, and a second conductive semiconductor layer laminated in stated order on the substrate. A waveguide extending in a first direction parallel to the main surface of the substrate is formed in the layered structure. In a cross section perpendicular to the first direction, the bonding material includes: an inner region bonded to the semiconductor laser element; and among regions located outward of the inner region, one outer region located on a side of the inner region that corresponds to one side surface of the semiconductor laser element and an other outer region located on a side of the inner region that corresponds to an other side surface of the semiconductor laser element. The one outer region includes a region located outward of the one side surface. The other outer region includes a region located outward of the other side surface. The one outer region is spaced apart from the one side surface of the semiconductor laser element. A width A of the semiconductor laser element, a width B of the one outer region, and a width C of the other outer region in a second direction satisfy $B \geq A/4$ and $C \geq A/4$, the second direction being perpendicular to the first direction and parallel to the main surface of the substrate.

In one aspect of the semiconductor laser device according to the present disclosure, width A of the semiconductor laser element, width B of the one outer region, and width C of the other outer region may satisfy at least one of $B \geq A/2$ or $C \geq A/2$.

In one aspect of the semiconductor laser device according to the present disclosure, width B of the one outer region may be equal to width C of the other outer region.

In one aspect of the semiconductor laser device according to the present disclosure, the bonding material may have an average thickness of less than 3.5 μm.

In one aspect of the semiconductor laser device according to the present disclosure, the bonding material in the inner region may have a maximum thickness at a position closer to the other side surface than to the one side surface, and a maximum thickness t3 of the inner region and a thickness t4 of a flat portion of the bonding material in the other outer region may satisfy t4≤t3.

In one aspect of the semiconductor laser device according to the present disclosure, the bonding material in the inner region may have a minimum thickness at a position closer to the one side surface than to the other side surface, and a minimum thickness t1 of the bonding material in the inner region and a thickness t2 of a flat portion of the bonding material in the one outer region may satisfy t2≤t1.

In one aspect of the semiconductor laser device according to the present disclosure, on at least one of the one outer region or the other outer region, a surface of a portion located between the semiconductor laser element and the submount may be a recessed surface or a flat surface.

In one aspect of the semiconductor laser device according to the present disclosure, at at least one of the one side surface or the other side surface, the semiconductor laser element may include a stepped portion formed at an end portion closer to the submount, and the semiconductor laser element and the bonding material may be spaced apart at the stepped portion.

In one aspect of the semiconductor laser device according to the present disclosure, at the one side surface, the semiconductor laser element may include a first stepped portion formed at an end portion closer to the submount, and at the other side surface, may include a second stepped portion formed at an end portion closer to the submount, the semiconductor laser element and the bonding material may be spaced apart at the first stepped portion and the second stepped portion, a maximum thickness t13 of the bonding material in the one outer region and a distance t12 between the first stepped portion and a surface of the bonding material that faces the submount may satisfy t13≤t12, and a maximum thickness t17 of the bonding material in the other outer region and a distance t16 between the second stepped portion and a surface of the bonding material that faces the submount may satisfy t17≤t16.

In one aspect of the semiconductor laser device according to the present disclosure, the maximum thickness t15 of the bonding material in the inner region, the minimum thickness t11 of the bonding material in the inner region, the maximum thickness t13 of the bonding material in the one outer region, and the maximum thickness t17 of the bonding material in the other outer region may satisfy at least one of t13≤t11×4 or t17≤t15×4.

In one aspect of the semiconductor laser device according to the present disclosure, the maximum thickness t15 of the bonding material in the inner region, the minimum thickness t11 of the bonding material in the inner region, the maximum thickness t13 of the bonding material in the one outer region, and the maximum thickness t17 of the bonding material in the other outer region may satisfy at least one of t13≤t11×2 or t17≤t15×2.

In one aspect of the semiconductor laser device according to the present disclosure, at the one side surface, the semiconductor laser element may include a first stepped portion formed at an end portion closer to the submount, and at the other side surface, may include a second stepped portion formed at an end portion closer to the submount, the semiconductor laser element and the bonding material may be spaced apart at the first stepped portion and the second stepped portion, the bonding material in the inner region may have a maximum thickness at a position closer to the other side surface than to the one side surface and a minimum thickness at a position closer to the one side surface than to the other side surface, and a maximum thickness t15 of the bonding material in the inner region, a minimum thickness t11 of the bonding material in the inner region, a thickness t14 of the bonding material at an outer edge portion of the one outer region, and a thickness t18 of the bonding material at an outer edge portion of the other outer region may satisfy at least one of t11≥t14/1.5 or t15≥t18/1.5.

In one aspect of the semiconductor laser device according to the present disclosure, the semiconductor laser element may include an insulating layer disposed between the layered structure and the bonding material, and the insulating layer may be spaced apart from the bonding material at both end portions in the second direction of the semiconductor laser element.

In one aspect of the semiconductor laser device according to the present disclosure, the semiconductor laser element may include a front end surface that emits laser light in the first direction and a rear end surface on an opposite side relative to the front end surface, and the front end surface may be located outward of the submount from an outer edge portion of the submount in the first direction.

In one aspect of the semiconductor laser device according to the present disclosure, the rear end surface may be located inward of the submount from the outer edge portion of the submount in the first direction, the bonding material may be present between the rear end surface and the outer edge portion of the submount, and the bonding material may be spaced apart from the rear end surface.

In one aspect of the semiconductor laser device according to the present disclosure, a thickness t5 at a flat portion of the bonding material located between the rear end surface and the outer edge portion of the submount, and a thickness t6 of the bonding material at a position inward of the semiconductor laser element from the rear end surface by a distance equal to the width A of the semiconductor laser element may satisfy t5≤t6.

In one aspect of the semiconductor laser device according to the present disclosure, a distance t22 between the rear end surface and a surface of the bonding material that faces the submount and a maximum thickness t23 of the bonding material located between the rear end surface and the outer edge portion of the submount may satisfy t23≤t22.

In one aspect of the semiconductor laser device according to the present disclosure, in the first direction, the maximum thickness t21 of the bonding material at a position inward of the semiconductor laser element from the rear end surface by a distance equal to the width A of the semiconductor laser element, and the maximum thickness t23 of the bonding material located between the rear end surface and the outer edge portion of the submount may satisfy t23≤t21×4.

In one aspect of the semiconductor laser device according to the present disclosure, in the first direction, the maximum thickness t21 of the bonding material at a position inward of the semiconductor laser element from the rear end surface by a distance equal to the width A of the semiconductor laser element, and the maximum thickness t23 of the bonding material located between the rear end surface and the outer edge portion of the submount may satisfy t23≤t21×2.

In one aspect of the semiconductor laser device according to the present disclosure, in the first direction, the maximum thickness t21 of the bonding material at a position inward of the semiconductor laser element from the rear end surface by a distance equal to the width A of the semiconductor laser element, and a thickness t24 of an outer edge portion of the bonding material located between the rear end surface and the outer edge portion of the submount may satisfy t21≥t24/1.5.

In one aspect of the semiconductor laser device according to the present disclosure, the distance D, in the first direction, between the rear end surface and the outer edge portion of the bonding material located between the rear end surface and the outer edge portion of the submount, and the width A of the semiconductor laser element may satisfy D≥A/4.

In one aspect of the semiconductor laser device according to the present disclosure, the distance D, in the first direction, between the rear end surface and the outer edge portion of the bonding material located between the rear end surface and the outer edge portion of the submount, and the width A of the semiconductor laser element may satisfy D≥A/2.

In one aspect of the semiconductor laser device according to the present disclosure, the semiconductor laser element may include an insulating layer disposed between the layered structure and the bonding material, and the insulating layer may be spaced apart from the bonding material at an end portion of the semiconductor laser element in the first direction that is closer to the rear end surface.

In one aspect of the semiconductor laser device according to the present disclosure, the submount may include a metal electrode film electrically connected to the bonding material, and a barrier layer disposed between the electrode film and the bonding material.

In one aspect of the semiconductor laser device according to the present disclosure, a surface area S1 of the barrier layer and a surface area S2 of the portion of the bonding material that is in contact with the submount may satisfy S1≥S2.

In one aspect of the semiconductor laser device according to the present disclosure, the submount may include a first base, and an adhesion layer disposed between the first base and the electrode film.

One aspect of the method for manufacturing the semiconductor laser device according to the present disclosure includes: a process of preparing a submount that includes an electrode film and a bonding material laminated above the electrode film; a process of disposing a semiconductor laser element on the bonding material; a first heating process of heating the submount to melt the bonding material after the process of disposing the semiconductor laser element; a first temperature lowering process of lowering the temperature of the submount after the first heating process; a second heating process of heating the submount after the first temperature lowering process; and a second temperature lowering process of lowering the temperature of the submount after the second heating process.

In one aspect of the method for manufacturing the semiconductor laser device according to the present disclosure, melting point Tm of the bonding material, first peak temperature T1, which is the peak temperature in the first heating process, and second peak temperature T2, which is the peak temperature in the second heating process, may satisfy Tm<T1<T2.

Advantageous Effects

According to the present disclosure, it is possible to provide, for example, a semiconductor laser device that can inhibit bonding material from adhering to side surfaces of the semiconductor laser element.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, embodiments of the present disclosure will be described with reference to the drawings. Each of the following embodiments shows a specific example of the present disclosure. The numerical values, shapes, materials, elements, the arrangement and connection of the elements, etc., indicated in the following embodiments are mere examples, and therefore do not intend to limit the present disclosure.

The figures are schematic illustrations and are not necessarily precise depictions. Accordingly, the figures are not necessarily to scale. Elements that are essentially the same share like reference signs in the figures, and duplicate description is omitted or simplified.

Moreover, in the present specification, the terms "above" and "below" do not refer to the vertically upward direction and the vertically downward direction in terms of absolute spatial recognition, but are used as terms defined by relative positional relationships based on the layering order in a layered configuration. Furthermore, the terms "above" and "below" are applied not only when two elements are disposed with a gap therebetween or when a separate element is interposed between two elements, but also when two elements are disposed in contact with each other.

Embodiment 1

First, the semiconductor laser device and the method for manufacturing the semiconductor laser device according to Embodiment 1 will be described.

1-1. Overall Configuration

Figure 1:
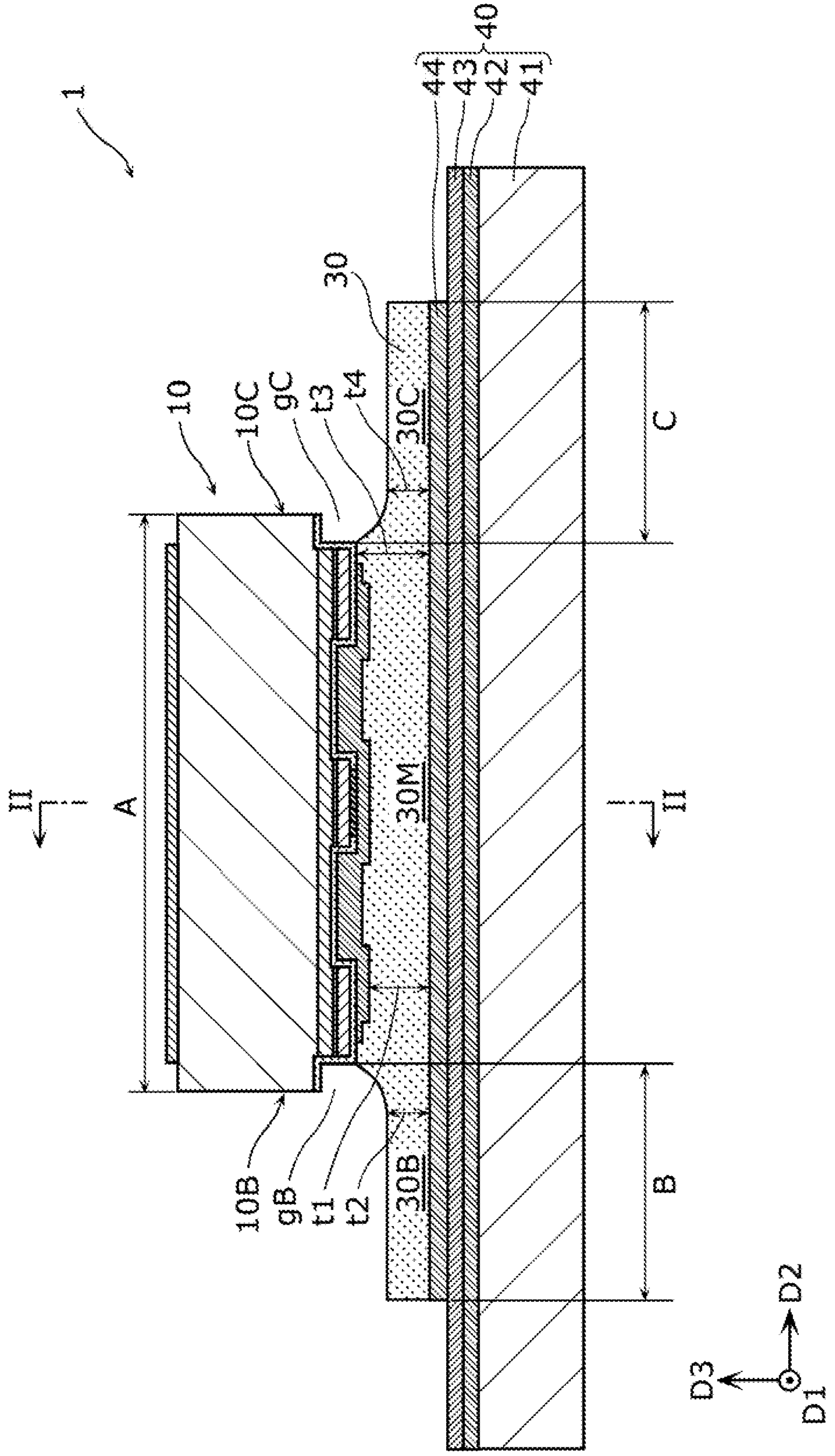
FIG. 1 is a schematic cross-sectional view illustrating a cross section of a semiconductor laser device according to Embodiment 1 taken perpendicular to a first direction.
Figure 2:
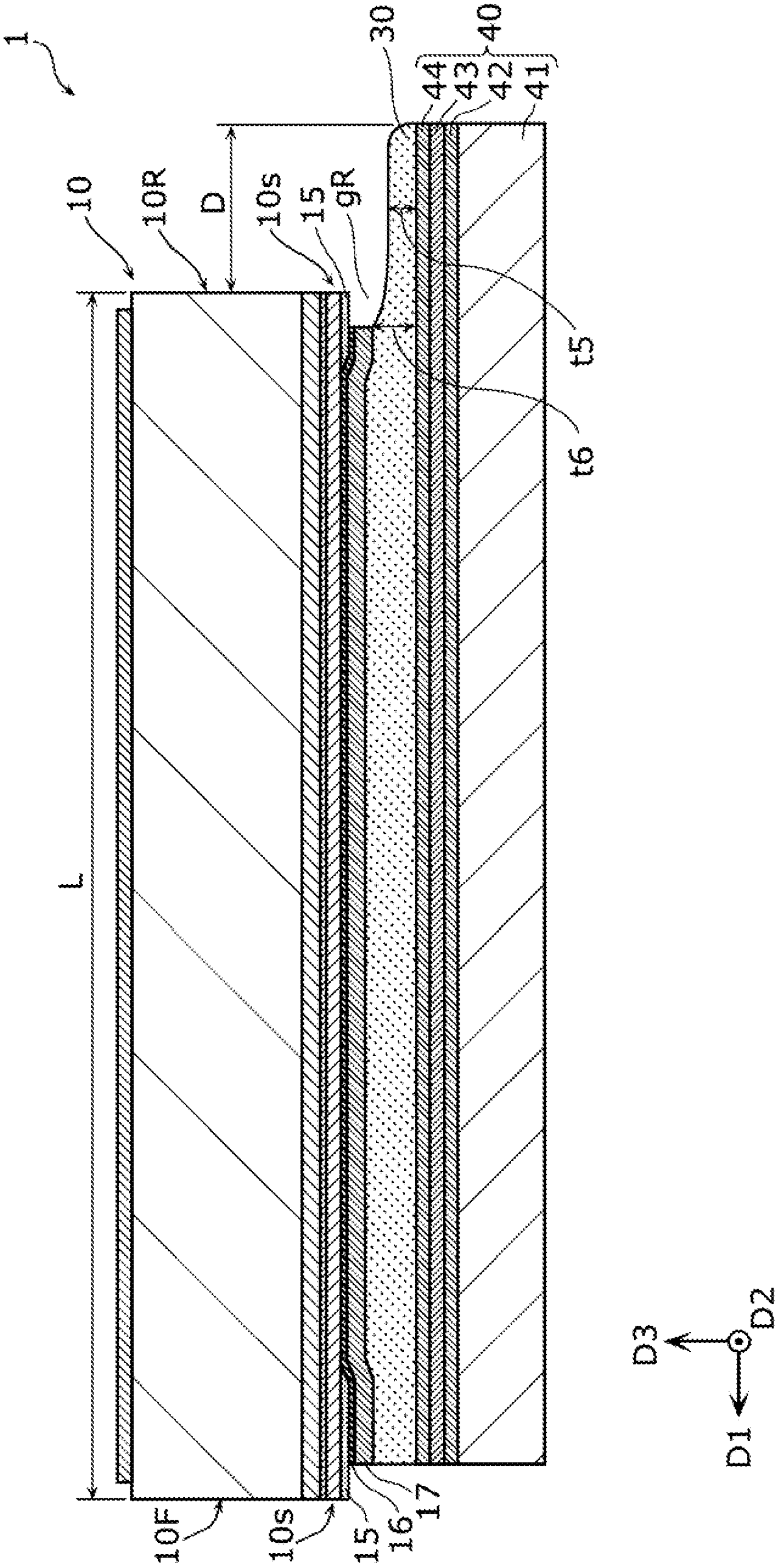
FIG. 2 is a schematic cross-sectional view illustrating a cross section of the semiconductor laser device according to Embodiment 1 taken perpendicular to a second direction.

First, the overall configuration of the semiconductor laser device according to the present embodiment will be described with reference to FIG. 1 and FIG. 2. FIG. 1 and FIG. 2 are schematic cross-sectional views illustrating cross sections of semiconductor laser device 1 according to the present embodiment taken perpendicular to first direction D1 and second direction D2, respectively. FIG. 2 illustrates a cross section taken at line II-II in FIG. 1.

As illustrated in FIG. 1 and FIG. 2, semiconductor laser device 1 includes submount 40, semiconductor laser element 10, and bonding material 30 that bonds submount 40 and semiconductor laser element 10.

Figure 3:
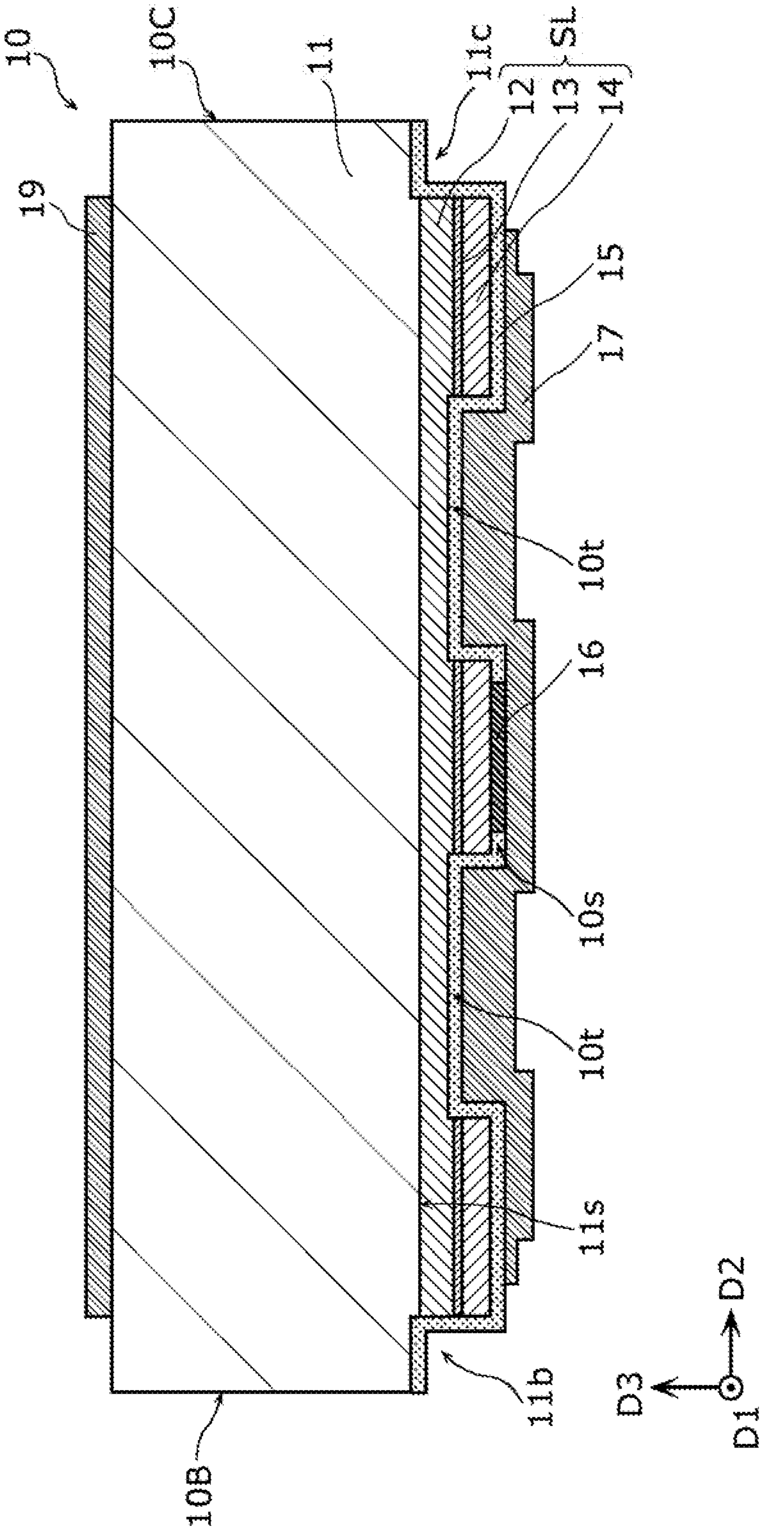
FIG. 3 is a schematic cross-sectional view of the overall configuration of a semiconductor laser element according to Embodiment 1.

Semiconductor laser element 10 is bonded to the main surface of submount 40, and emits laser light. The overall configuration of semiconductor laser element 10 will be described below with reference to FIG. 3. FIG. 3 is a schematic cross-sectional view of the overall configuration of semiconductor laser element 10 according to the present embodiment. FIG. 3 illustrates a cross section of semiconductor laser element 10 taken perpendicular to first direction D1.

As illustrated in FIG. 3, semiconductor laser element 10 includes substrate 11 and layered structure SL. In the present embodiment, semiconductor laser element 10 further includes insulating layer 15, p-side contact electrode 16, p-side electrode 17, and n-side electrode 19. As illustrated in FIG. 1 and FIG. 2, semiconductor laser element 10 is disposed with layered structure SL facing submount 40, and p-side electrode 17 is electrically connected to submount 40. Stated differently, semiconductor laser element 10 is mounted junction-down on submount 40.

A waveguide extending in first direction D1 parallel to main surface 11*s* of substrate 11 is formed in layered structure SL. As illustrated in FIG. 2, semiconductor laser element 10 includes front end surface 10F that emits laser light in first direction D1, and rear end surface 10R on the opposite side relative to front end surface 10F. Front end surface 10F and rear end surface 10R constitute the resonator of semiconductor laser element 10. The dimension of semiconductor laser element 10 in first direction D1 corresponds to resonator length L. For example, resonator length L is approximately between 1 mm and 10 mm, inclusive. In the present embodiment, resonator length L is 1.2 mm. Front end surface 10F of semiconductor laser element 10 is located outward of submount 40 from the outer edge portion of submount 40 in first direction D1. Stated differently, front end surface 10F of semiconductor laser element 10 protrudes outward of submount 40 from the end edge of submount 40 in first direction D1. This makes it possible to inhibit the laser light emitted from front end surface 10F from interfering with submount 40.

Width A of semiconductor laser element 10 illustrated in FIG. 1 represents the dimension of semiconductor laser element 10 in second direction D2, which is perpendicular to first direction D1 and parallel to main surface 11*s* of substrate 11. Third direction D3 illustrated in FIG. 1 through FIG. 3 is perpendicular to first direction D1 and second direction D2. For example, width A of semiconductor laser element 10 is approximately between 0.1 mm and 3 mm, inclusive. In the present embodiment, width A of semiconductor laser element 10 is 0.15 mm.

As illustrated in FIG. 3, stepped portions 11*b* and 11*c* are formed at side surfaces 10B and 10C, respectively, of semiconductor laser element 10 according to the present embodiment. Stepped portion 11*b* is one example of the first stepped portion formed at the one side surface 10B of semiconductor laser element 10, at the end portion closer to submount 40. Stepped portion 11*c* is one example of the second stepped portion formed at the other side surface 10C of semiconductor laser element 10, at the end portion closer to submount 40. Stepped portions 11*b* and 11*c* are part of the separation groove extending in first direction D1 that is formed when semiconductor laser element 10 is singulated. Each stepped portion is a portion recessed in second direction D2 from the respective side surface.

Next, each element of semiconductor laser element 10 will be described with reference to FIG. 3.

Substrate 11 is a plate-shaped component that serves as the base of semiconductor laser element 10. In the present embodiment, substrate 11 is a semiconductor substrate including n-type GaN.

Layered structure SL is a semiconductor layered structure that is laminated on main surface 11*s* of substrate 11. In the present embodiment, layered structure SL includes n-type semiconductor layer 12, active layer 13, and p-type semiconductor layer 14 laminated on substrate 11 in the stated order. Layered structure SL may include other additional layers. Two groove portions 10*t* extending in first direction D1 are formed in layered structure SL. Groove portions 10*t* exist from at least p-type semiconductor layer 14 to n-type semiconductor layer 12 of layered structure SL. The formation of the two groove portions 10*t* forms ridge portion 10*s* between the two groove portions 10*t*. Light is emitted by active layer 13 in ridge portion 10*s* when current is supplied to ridge portion 10*s*. The area including ridge portion 10*s* forms the waveguide.

N-type semiconductor layer 12 is one example of the first conductive semiconductor layer that is laminated above main surface 11*s* of substrate 11. In the present embodiment, n-type semiconductor layer 12 includes at least an n-type cladding layer. N-type semiconductor layer 12 may include, for example, a buffer layer disposed between substrate 11 and the n-type cladding layer, and an n-side guide layer disposed between the n-type cladding layer and active layer 13. In the present embodiment, n-type semiconductor layer 12 is formed of an n-type nitride semiconductor such as n-type AlGaN.

Active layer 13 is a light-emitting layer laminated above n-type semiconductor layer 12. In the present embodiment, active layer 13 is a quantum well active layer formed of a nitride semiconductor.

P-type semiconductor layer 14 is one example of the second conductive semiconductor layer that is disposed above active layer 13. In the present embodiment, p-type semiconductor layer 14 includes at least a p-type cladding layer. P-type semiconductor layer 14 may include, for example, a contact layer disposed between the p-type cladding layer and p-side contact electrode 16, and a p-side guide layer disposed between the p-type cladding layer and active layer 13. In the present embodiment, p-type semiconductor layer 14 is formed of a p-type nitride semiconductor such as p-type AlGaN.

Insulating layer 15 is a layer that electrically insulates p-side electrode 17 and layered structure SL. Insulating layer 15 may have a function to confine light to ridge portion 10*s*. In the present embodiment, insulating layer 15 is disposed between layered structure SL and p-side electrode 17. Insulating layer 15 covers the surface of layered structure SL continuously from the side surface of ridge portion 10*s* to stepped portions 11*b* and 11*c*. At the top portion of ridge portion 10*s*, an opening is provided in insulating layer 15, and ridge portion 10*s* and *p*-side electrode 17 are connected via p-side contact electrode 16 disposed in the opening in insulating layer 15. As illustrated in FIG. 1, insulating layer 15 is spaced apart from bonding material 30 at both end portions in second direction D2 of semiconductor laser element 10. As illustrated in FIG. 2, the outer edge portion of ridge portion 10*s* on the front end surface 10F side and the outer edge portion of ridge portion 10*s* on the rear end surface 10R side are covered by insulating layer 15. At the outer edge portion on the front end surface 10F side and the outer edge portion on the rear end surface 10R side, insulating layer 15 is exposed from p-side contact electrode 16 and p-side electrode 17, and the end portions of p-side contact electrode 16 and the end portions of p-side electrode 17 ride up above insulating layer 15. The end portions of p-side contact electrode 16 and the end portions of p-side electrode 17 are spaced apart from front end surface 10F and rear end surface 10R. At the outer edge portions of semiconductor laser element 10 on the front end surface 10F side and the rear end surface 10R side, insulating layer 15 is exposed from p-side contact electrode 16 and p-side electrode 17, and exposed from p-side electrode 17 at stepped portions 11*b* and 11*c*. Insulating layer 15 is spaced apart from bonding material 30 at the end portion closer to rear end surface 10R in first direction D1 of semiconductor laser element 10. For example, an $SiO_2$ film or SiN film or the like can be used as insulating layer 15.

P-side contact electrode 16 is one example of the second conductive side contact electrode that makes ohmic contact with the second conductive semiconductor layer. In the present embodiment, p-side contact electrode 16 is an electrode that makes ohmic contact with p-type semiconductor layer 14. P-side contact electrode 16 is disposed within the opening in insulating layer 15, and is in contact with the top portion of ridge portion 10*s*. For example, a layered film of Pd and Pt, or a layered film of Pd, Ti, and Pt laminated in the stated order on p-type semiconductor layer 14 can be used as p-side contact electrode 16.

P-side electrode 17 is an electrode that is electrically connected to p-type semiconductor layer 14 via p-side contact electrode 16. P-side electrode 17 covers the top surface of insulating layer 15 except for the outer edge portions of insulating layer 15. Stated differently, p-side electrode 17 is not disposed on the outer edge portion of ridge portion 10*s* on the front end surface 10F side or on the outer edge portion of ridge portion 10*s* on the rear end surface 10R side. P-side electrode 17 is also not disposed on stepped portions 11*b* and 11*c* of semiconductor laser element 10. In the present embodiment, for example, a single layer film such as a Ti film, or a layered film of Ti and Pt or Ti, Pt, Au, and Pt laminated in the stated order on p-side contact electrode 16 can be used as p-side electrode 17. Furthermore, an Au film may be formed on the outermost layer of p-side electrode 17. The Au film formed on the outermost layer may be integrated with bonding material 30, which includes AuSn or the like and bonds p-side electrode 17. In such cases, the Au film that is integrated with bonding material 30 may be considered as part of bonding material 30.

N-side electrode 19 is an electrode formed on the main surface of substrate 11 that is on the reverse side relative to the main surface on which layered structure SL is laminated. For example, a layered film of Ti and Au laminated in the stated order on substrate 11 can be used as n-side electrode 19.

The compositions of p-side contact electrode 16, p-side electrode 17, and n-side electrode 19 are not limited to the compositions described above. For example, a layered film or alloy film including at least one of C, N, Co, Cu, Ag, Ir, Sc, Au, Cr, Mo, La, W, Al, TI, Y, La, Ce, Pr, Nd, Sm, Eu, Tb, Ti, Zr, Hf, V, Nb, Ta, Pt, or Ni may be used as each electrode.

Submount 40 is the base to which semiconductor laser element 10 is bonded. Submount 40 functions as a heat sink from which heat generated by semiconductor laser element 10 is discharged. In the present embodiment, submount 40 has a plate-like shape. As illustrated in FIG. 1 and FIG. 2, submount 40 includes first base 41, adhesion layer 42, electrode film 43, and barrier layer 44.

First base 41 is the main component of submount 40. In the present embodiment, first base 41 has a rectangular plate-like shape. For example, a ceramic, polycrystalline, or monocrystalline substrate comprising a material such as alumina, AlN, SiC, or diamond can be used as first base 41.

Adhesion layer 42 is a layer disposed between first base 41 and electrode film 43. For example, a single layer film such as a Ti film, or a layered film of Ti and Pt laminated in the stated order on first base 41 can be used as adhesion layer 42. The composition of adhesion layer 42 is not limited to these examples; adhesion layer 42 may be a layered film or alloy film similar to, for example, p-side contact electrode 16 described above.

Electrode film 43 is a metal film that is electrically connected to bonding material 30. Electrode film 43 functions as an electrode of submount 40. For example, Au can be used as electrode film 43. This allows wires made of Au to be easily connected to electrode film 43.

Barrier layer 44 is a metal layer disposed between electrode film 43 and bonding material 30. Barrier layer 44 is connected to bonding material 30. Barrier layer 44 is made of a material with low wettability to bonding material 30, which is made of solder or the like, and functions to inhibit heated and melted bonding material 30 from coming into contact with electrode film 43. Surface area 51 of barrier layer 44 and surface area S2 of the portion of bonding material 30 that is in contact with submount 40 satisfy $S1 \geq S2$. This makes it possible to inhibit heated and melted bonding material 30 from coming into contact with electrode film 43.

For example, Pt can be used as barrier layer 44. The composition of barrier layer 44 is not limited to this example; barrier layer 44 may be, for example, a layered film or alloy film including at least one of Ti, Pt, Ni, Cr, Co, Ru, or W.

Bonding material 30 is a component that bonds submount 40 and semiconductor laser element 10 together. As illustrated in FIG. 1, in a cross section perpendicular to first direction D1, bonding material 30 includes inner region 30M bonded to semiconductor laser element 10, and among regions of bonding material 30 located outward of inner region 30M, one outer region 30B located on the side of inner region 30M that corresponds to the one side surface 10B of semiconductor laser element 10, and another outer region 30C located on the side of inner region 30M that corresponds to the other side surface 10C of semiconductor laser element 10. Stated differently, among regions of bonding material 30 located outward of inner region 30M, outer region 30B is the region on the side near side surface 10B of semiconductor laser element 10, and outer region 30C is the region on the side near side surface 10C of semiconductor laser element 10. The one outer region 30B of bonding material 30 includes a region located outward of the one side surface 10B of semiconductor laser element 10 in second direction D2, and a region located between semiconductor laser element 10 and submount 40, inward of the one side surface 10B of semiconductor laser element 10 in second direction D2. The other outer region 30C of bonding material 30 includes a region located outward of the other side surface 10C of semiconductor laser element 10 in second direction D2, and a region located between semiconductor laser element 10 and submount 40, inward of the other side surface 10C of semiconductor laser element 10 in second direction D2. The region where bonding material 30 bonds with semiconductor laser element 10 approximately corresponds to the region where p-side electrode 17 is formed. Bonding material 30 is spaced apart from insulating layer 15 exposed from p-side electrode 17 on the front end surface 10F side and the rear end surface 10R side of semiconductor laser element 10, and is also spaced apart from insulating layer 15 exposed from p-side electrode 17 at stepped portions 11*b* and 11*c* of semiconductor laser element 10. Bonding material 30 is made of, for example, AuSn solder. Bonding material 30 is not limited to AuSn solder, and may be a solder such as AgSn solder or SAC solder, and other than solder, may be a conductive paste such as Au nanoparticle paste or Ag nanoparticle paste. The configuration of bonding material 30 will be described in greater detail later.

1-2. Operation and Advantageous Effects

Next, the operation and advantageous effects of semiconductor laser device 1 according to the present embodiment will be described with reference to FIG. 1 through FIG. 4 in comparison with a comparative example.

In semiconductor laser device 1 according to the present embodiment, width A of semiconductor laser element 10, width B of the one outer region 30B of bonding material 30, and width C of the other outer region 30C of bonding material 30 in second direction D2 satisfy $B \geq A/4$ and $C \geq A/4$.

Figure 4:
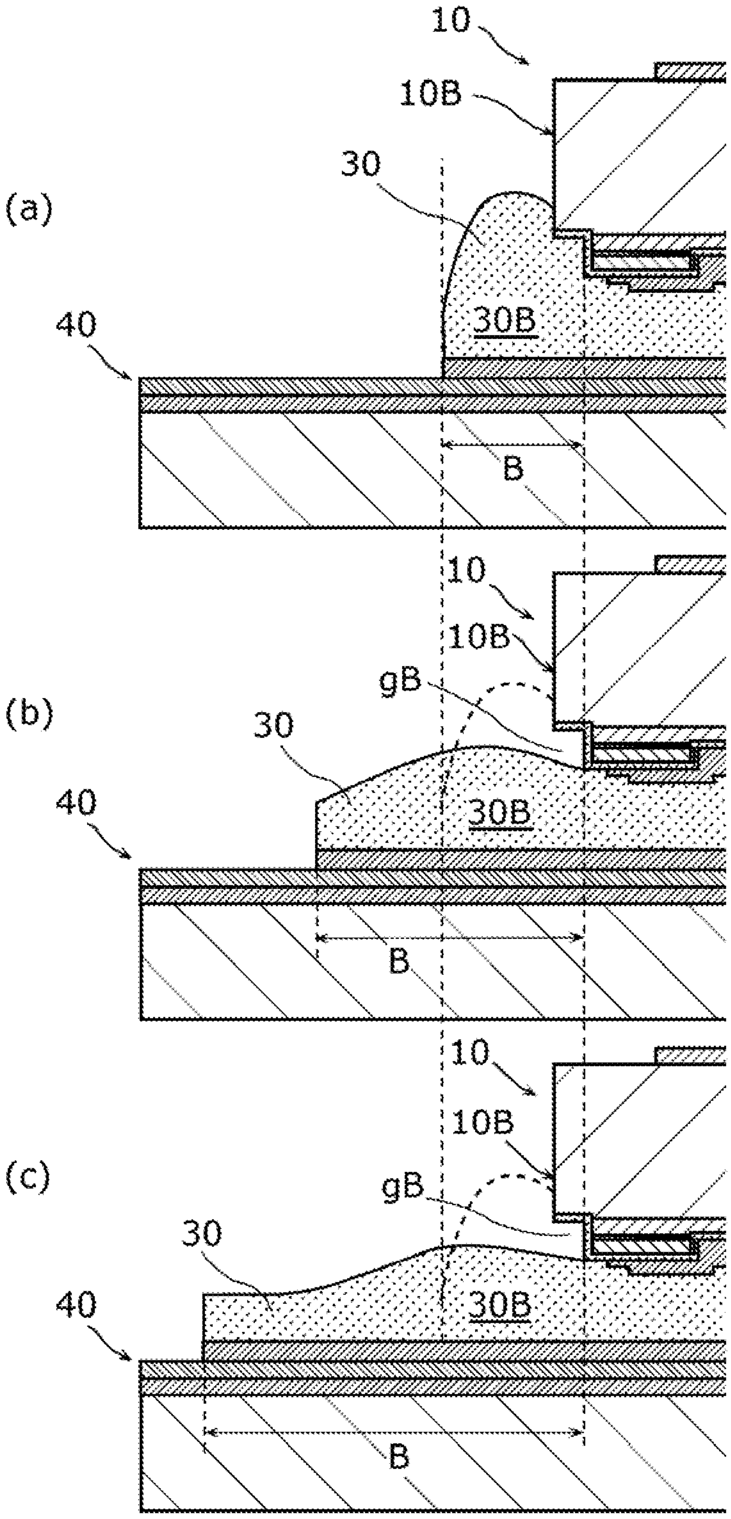
FIG. 4 is a schematic diagram illustrating the relationship between the width of one outer region of a bonding material and the maximum thickness of the bonding material at the one outer region according to a comparative example and Embodiment 1.

Next, the relationship between the widths of outer regions 30B and 30C of bonding material 30 of semiconductor laser device 1 and the shape of bonding material 30 will be described with reference to FIG. 4. FIG. 4 is a schematic diagram illustrating the relationship between width B of the one outer region 30B of bonding material 30 and the maximum thickness of bonding material 30 at the one outer region 30B according to a comparative example and the present embodiment. In FIG. 4, the cross-sectional view labeled (a) illustrates the comparative example, and the cross-sectional views labeled (b) and (c) illustrate two examples of the present embodiment. In the comparative example illustrated in the cross-sectional view labeled (a) in FIG. 4, outer region 30B is defined as the region located outward of the side surface of semiconductor laser element 10 since the entire bottom surface of semiconductor laser element 10 (i.e., the surface facing submount 40) is bonded to bonding material 30, but for the sake of comparison with width B of outer region 30B according to the present embodiment illustrated in the cross-sectional views labeled (b) and (c), width B in the comparative example in (a) of FIG. 4 is considered to be for the region located outward of stepped portion 11*b* of semiconductor laser element 10. Hereinafter, widths B and C are assumed to be approximately the same, and only the relationship between width B and the maximum thickness of bonding material 30 in the one outer region 30B will be discussed.

The cross-sectional view labeled (a) in FIG. 4 illustrates the shape of outer region 30B when $B < A/4$ regarding width B of outer region 30B. The cross-sectional view labeled (b) in FIG. 4 illustrates the shape of outer region 30B when $B \geq A/4$ regarding width B of outer region 30B. The cross-sectional view labeled (c) in FIG. 4 illustrates the shape of outer region 30B when width B of outer region 30B is further increased compared to the cross-sectional view labeled (b).

Bonding material 30 illustrated in each cross-sectional view in FIG. 4 is heated and melted when bonding semiconductor laser element 10. A load is also applied to semiconductor laser element 10 to increase the contact surface area between semiconductor laser element 10 and bonding material 30. This presses semiconductor laser element 10 against submount 40. At this time, part of bonding material 30 between semiconductor laser element 10 and submount 40 is pushed out to outer region 30B (and outer region 30C). Assuming that the thickness of bonding material 30 in each cross-sectional view in FIG. 4 is the same before bonding semiconductor laser element 10, a similar amount of bonding material 30 is pushed out to outer region 30B in each cross-sectional view. Therefore, the narrower the width of outer region 30B is, the greater the maximum thickness of bonding material 30 in outer region 30B is. When width B is narrow as illustrated in the cross-sectional view labeled (a) in FIG. 4, the maximum thickness of bonding material 30 in outer region 30B is greater than the distance from submount 40 to side surface 10B of semiconductor laser element 10, whereby bonding material 30 may adhere to side surface 10B. Since bonding material 30 is formed in direct contact with barrier layer 44 only in the region where barrier layer 44 is formed, the outer edge portion of outer region 30B in second direction D2 approximately coincides with the outer edge portion of barrier layer 44. Bonding material 30 is not in direct contact with electrode film 43.

In contrast, as illustrated in the cross-sectional value labeled (b) in FIG. 4, when width $B \geq A/4$, since bonding material 30 pushed out to outer region 30B is distributed in the width direction (i.e., second direction D2), the maximum thickness of bonding material 30 in outer region 30B is less than the distance from submount 40 to side surface 10B of semiconductor laser element 10. Accordingly, outer region 30B is spaced apart from side surface 10B of semiconductor laser element 10. Stated differently, gap gB is formed between side surface 10B and outer region 30B of bonding material 30. This makes it possible to inhibit bonding material 30 from adhering to side surface 10B of semiconductor laser element 10.

In the cross-sectional view labeled (c) in FIG. 4, since width B is even greater than in the cross-sectional view labeled (c), the maximum thickness of bonding material 30 in outer region 30B is reduced even further. This further inhibits bonding material 30 from adhering to side surface 10B of semiconductor laser element 10.

As illustrated in FIG. 1, outer region 30C has the same configuration as outer region 30B. In other words, the other outer region 30C is spaced apart from the other side surface 10C of semiconductor laser element 10. Stated differently, gap gC is formed between the other side surface 10C and the other outer region 30C of bonding material 30. This makes it possible to inhibit bonding material 30 from adhering to the other side surface 10C of semiconductor laser element 10.

As described above, the present embodiment can inhibit bonding material 30 from adhering to side surfaces 10B and 10C of semiconductor laser element 10, and thus can inhibit bonding material 30 from short circuiting p-type semiconductor layer 14 and n-type semiconductor layer 12.

Width A of semiconductor laser element 10, width B of the one outer region 30B, and width C of the other outer region 30C may satisfy at least one of $B \geq A/2$ or $C \geq A/2$. Since the maximum thickness of bonding material 30 at each outer region can be further reduced, this further inhibits bonding material 30 from adhering to side surface 10B of semiconductor laser element 10.

Width A of semiconductor laser element 10, width B of the one outer region 30B, and width C of the other outer region 30C may satisfy $B \leq 2A$ and $C \leq 2A$. This can inhibit the enlargement of semiconductor laser device 1. Width A of semiconductor laser element 10, width B of the one outer region 30B, and width C of the other outer region 30C may satisfy $B \leq A$ and $C \leq A$. This can further inhibit the enlargement of semiconductor laser device 1.

Width B of the one outer region 30B may be equal to width C of the other outer region 30C. Here, width B being equal to width C means not only width B being exactly equal to width C, but also width B being substantially equal to width C. For example, width B being equal to width C means that the difference between width B and width C is 10% or less of width B. Thus, by making width B equal to width C, the maximum thickness of bonding material 30 in outer region 30B and outer region 30C can be made to be approximately the same. Since bonding material 30 can be inhibited from becoming thicker in one of outer regions 30B or 30C, bonding material 30 can therefore be inhibited from adhering to either side surface 10B or 10C of semiconductor laser element 10.

On at least one of the one outer region 30B or the other outer region 30C of bonding material 30, the surface of the portion located between semiconductor laser element 10 and submount 40 may be a recessed or flat surface. In the present embodiment, as illustrated in FIG. 1, on the one outer region 30B and the other outer region 30C of bonding material 30, the surfaces of the portions location between semiconductor laser element 10 and submount 40 are both recessed.

In the present embodiment, the average thickness of bonding material 30 may be less than 3.5 μm. The average thickness of bonding material 30 is equal to the thickness before semiconductor laser element 10 is disposed on bonding material 30. In this way, the thermal resistance in bonding material 30 can be reduced by reducing the average thickness of bonding material 30, thus enhancing the heat dissipation characteristics from semiconductor laser element 10 to submount 40. By reducing the average thickness of bonding material 30, it is possible to inhibit bonding material 30 from adhering to each side surface of semiconductor laser element 10. The average thickness of bonding material 30 may be less than 0.3% of resonator length L of semiconductor laser element 10. The average thickness of bonding material 30 may be less than 3% of width A of semiconductor laser element 10.

In the present embodiment, the average thickness of bonding material 30 may be greater than 2.0 μm. If bonding material 30 is too thin, bonding material 30 may not be sufficiently spread over the bonding surface of semiconductor laser element 10, resulting in a small bonding surface area between bonding material 30 and semiconductor laser element 10. However, by making the average thickness of bonding material 30 greater than 2.0 μm, the bonding surface area between semiconductor laser element 10 and bonding material 30 can be inhibited from diminishing. It is therefore possible to inhibit an increase in thermal resistance between semiconductor laser element 10 and bonding material 30 due to the smaller bonding surface area. The average thickness of bonding material 30 may be greater than 0.05% of resonator length L of semiconductor laser element 10. The average thickness of bonding material 30 may be greater than 0.4% of width A of semiconductor laser element 10.

The average thickness of bonding material 30 may be adjusted based on the dimensions of semiconductor laser element 10. For example, resonator length L [μm] of semiconductor laser element 10 and average thickness is of bonding material 30 may satisfy $ts < 2.0 + 0.5 \times (L/800)$. This allows the thickness of bonding material 30 to be optimized to the dimensions of semiconductor laser element 10.

In the present embodiment, as illustrated in FIG. 1, thickness t2 of the flat portion in the one outer region 30B and thickness t4 of the flat portion in the other outer region 30C may be less than or equal to maximum thickness t3 of bonding material 30 in inner region 30M. Here, the flat portion refers to the portion of the surface of each outer region (i.e., the surface of bonding material 30 on the reverse side relative to the surface facing submount 40) that is parallel to the main surface of submount 40. Note that parallel means not only a state in which the main surface of submount 40 is exactly parallel to the surface of bonding material 30, but also a state in which they are substantially parallel. For example, parallel means that the angle between the main surface of submount 40 and the surface of bonding material 30 is 2° or less. The thickness of the flat portion of each outer region may be defined as the thickness of the center portion in second direction D2 of each outer region.

In this way, by making the thickness of the flat portions in each outer region less than or equal to the maximum thickness of inner region 30M, the thickness of bonding material 30 in each outer region can be reduced while ensuring that the thickness of bonding material 30 is sufficient in inner region 30M. Therefore, bonding material 30 can be inhibited from adhering to each side surface of semiconductor laser element 10 while ensuring there is enough bonding surface area between semiconductor laser element 10 and bonding material 30.

Semiconductor laser element 10 may be disposed at an angle to the main surface of submount 40. For example, the maximum thickness of bonding material 30 in inner region 30M may be at a position closer to the other side surface 10C than to the one side surface 10B of semiconductor laser element 10. In such cases, maximum thickness t3 of inner region 30M and thickness t4 of the flat portion of bonding material 30 in the other outer region 30C may satisfy $t4 \leq t3$. In this configuration as well, by making thickness t4 of the flat portion in outer region 30C less than or equal to maximum thickness t3 of inner region 30M, bonding material 30 in outer region 30C can be inhibited from adhering to side surface 10C of semiconductor laser element 10 while ensuring there is enough bonding surface area between semiconductor laser element 10 and bonding material 30.

The minimum thickness of bonding material 30 in inner region 30M may be at a position closer to the one side surface 10B than to the other side surface 10C of semiconductor laser element 10. In such cases, minimum thickness t1 of bonding material 30 in inner region 30M and thickness t2 of the flat portion of bonding material 30 in the one outer region 30B may satisfy t2≤t1. In this configuration as well, by making thickness t2 of the flat portion in outer region 30B less than or equal to minimum thickness t1 of inner region 30M, bonding material 30 in outer region 30B can be inhibited from adhering to side surface 10B of semiconductor laser element 10 while ensuring there is enough bonding surface area between semiconductor laser element 10 and bonding material 30.

As illustrated in FIG. 3, at at least one of the one side surface 10B and the other side surface 10C, semiconductor laser element 10 may include a stepped portion formed at the end portion closer to submount 40, and semiconductor laser element 10 and bonding material 30 may be spaced apart at the stepped portion. A portion of insulating layer 15 disposed continuously from the side surface of ridge portion 10*s* is located in the stepped portion, exposed from p-side electrode 17, and bonding material 30 is spaced apart from insulating layer 15 located in the stepped portion. In the present embodiment, p-side electrode 17 is formed only on the top surface of layered structure SL and not on the side surface of layered structure SL, i.e., not on the stepped portion.

In the present embodiment, stepped portions 11*b* and 11*c* are formed at the one side surface 10B and the other side surface 10C, respectively. Stepped portions 11*b* and 11*c* formed in semiconductor laser element 10 can increase the distance from the surface of bonding material 30 to each side surface of semiconductor laser element 10, thereby inhibiting bonding material 30 from adhering to each side surface of semiconductor laser element 10.

As illustrated in FIG. 2, rear end surface 10R of semiconductor laser element 10 is located inward of submount 40 in first direction D1 from the outer edge portion of submount 40 (the right edge of submount 40 illustrated in FIG. 2), and bonding material 30 is present between rear end surface 10R and the outer edge portion of submount 40. Insulating layer 15 is disposed on the outer edge portion on the rear end surface 10R side of semiconductor laser element 10, exposed from p-side contact electrode 16 and p-side electrode 17. P-side electrode 17 is disposed over the entire top surface of layered structure SL, except for stepped portions 11*b* and 11*c*, the outer edge portion on the front end surface 10F side of semiconductor laser element 10, and the outer edge portion on the rear end surface 10R side of semiconductor laser element 10. Bonding material 30 bonds to p-side electrode 17 and does not bond to insulating layer 15. Therefore, bonding material 30 is spaced apart from insulating layer 15 at the outer edge portion on the rear end surface 10R side, and bonding material 30 is spaced apart from rear end surface 10R of semiconductor laser element 10. Stated differently, gap gR is formed between rear end surface 10R and bonding material 30. This makes it possible to inhibit bonding material 30 located outward of rear end surface 10R of semiconductor laser element 10 from adhering to rear end surface 10R of semiconductor laser element 10.

Thickness t5 at the flat portion of bonding material 30 located between rear end surface 10R of semiconductor laser element 10 and the outer edge portion of submount 40, and thickness t6 of bonding material 30 at a position inward of semiconductor laser element 10 from rear end surface 10R by a distance equal to width A of semiconductor laser element 10, satisfy t5≤t6. Here, the flat portion refers to the portion of the surface of bonding material 30 (i.e., the surface of bonding material 30 on the reverse side relative to the surface facing submount 40) that is parallel to the main surface of submount 40. Note that parallel means not only a state in which the main surface of submount 40 is exactly parallel to the surface of bonding material 30, but also a state in which they are substantially parallel. For example, parallel means that the angle between the main surface of submount 40 and the surface of bonding material 30 is 2° or less. The thickness of the flat portion may be defined as the thickness at the midpoint between the position of rear end surface 10R in second direction D2 and the outer edge portion of bonding material 30.

In this way, by satisfying t5≤t6, it possible to inhibit bonding material 30 located outward of rear end surface 10R of semiconductor laser element 10 from adhering to rear end surface 10R of semiconductor laser element 10.

Distance D, in first direction D1, between rear end surface 10R of semiconductor laser element 10 and the outer edge portion of bonding material 30 located between rear end surface 10R and the outer edge portion of submount 40, and width A of semiconductor laser element 10 satisfy D≥A/4. This reduces the maximum thickness of bonding material 30 at a position outward of rear end surface 10R, just as with outer regions 30B and 30C of bonding material 30 described above. Accordingly, it possible to inhibit bonding material 30 located outward of rear end surface 10R of semiconductor laser element 10 from adhering to rear end surface 10R of semiconductor laser element 10.

Distance D and width A of semiconductor laser element 10 may satisfy D≥A/2. This makes it possible to further inhibit bonding material 30 located outward of rear end surface 10R of semiconductor laser element 10 from adhering to rear end surface 10R of semiconductor laser element 10.

Distance D and width A of semiconductor laser element 10 may satisfy D≤2A. This can inhibit the enlargement of semiconductor laser device 1. Distance D and width A of semiconductor laser element 10 may satisfy D≤A. This can further inhibit the enlargement of semiconductor laser device 1.

In a cross section perpendicular to second direction D2 such as illustrated in FIG. 2, semiconductor laser element 10 may be bonded at an angle to the main surface of submount 40. For example, semiconductor laser element 10 may be bonded at an angle to the main surface of submount 40 so that the thickness of bonding material 30 increases from front end surface 10F toward rear end surface 10R of semiconductor laser element 10. In this case as well, each of the above configurations can inhibit bonding material 30 from adhering to rear end surface 10R of semiconductor laser element 10.

1-3. Manufacturing Method

Figure 5:
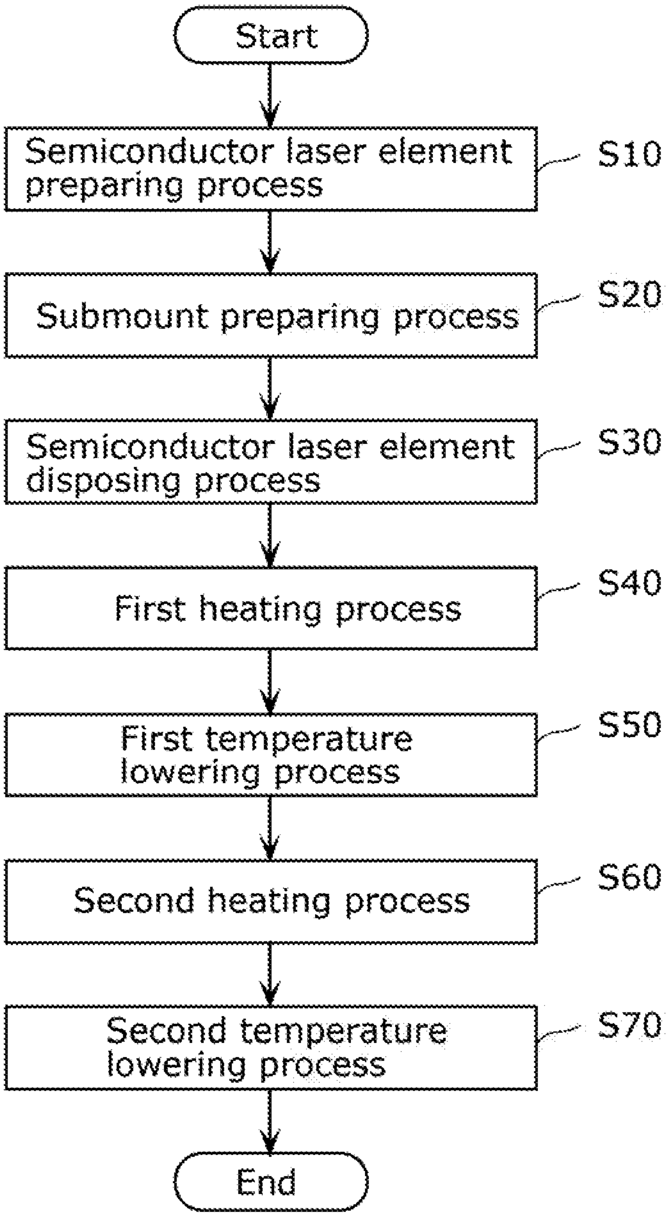
FIG. 5 is a flowchart of the method for manufacturing the semiconductor laser device according to Embodiment 1.
Figure 6:
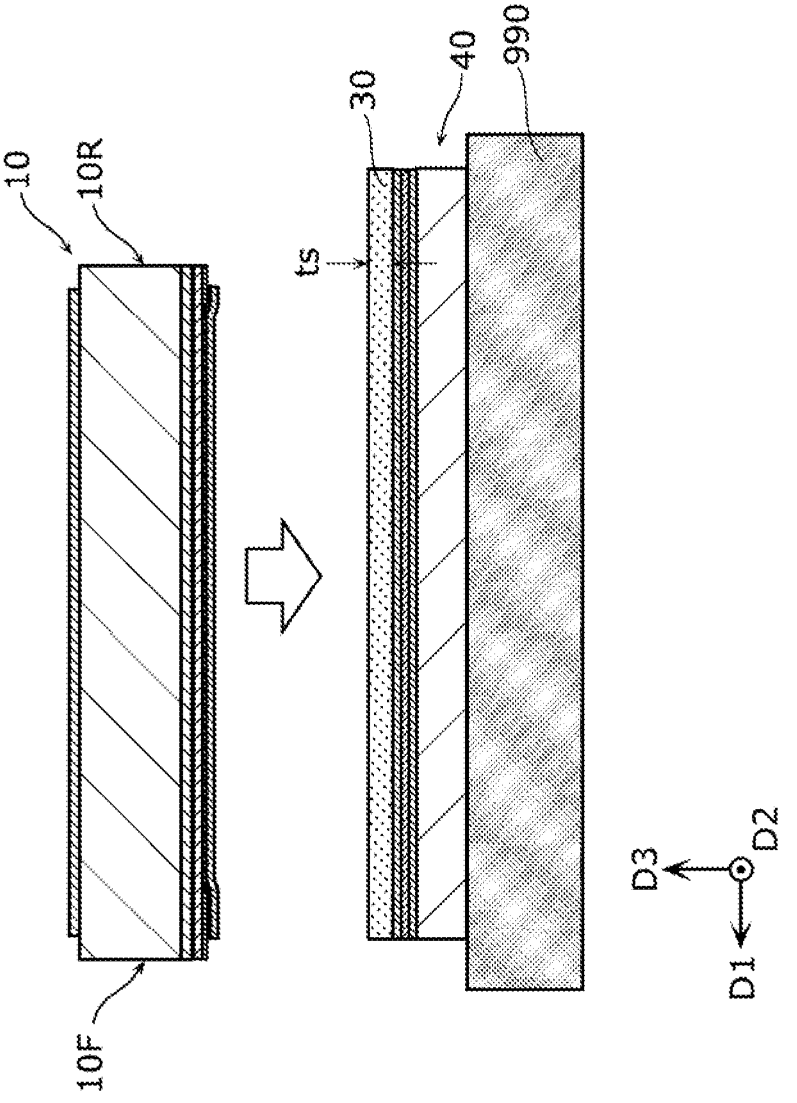
FIG. 6 is a schematic cross-sectional view illustrating the process of disposing the semiconductor laser element in the method for manufacturing the semiconductor laser device according to Embodiment 1.
Figure 7:
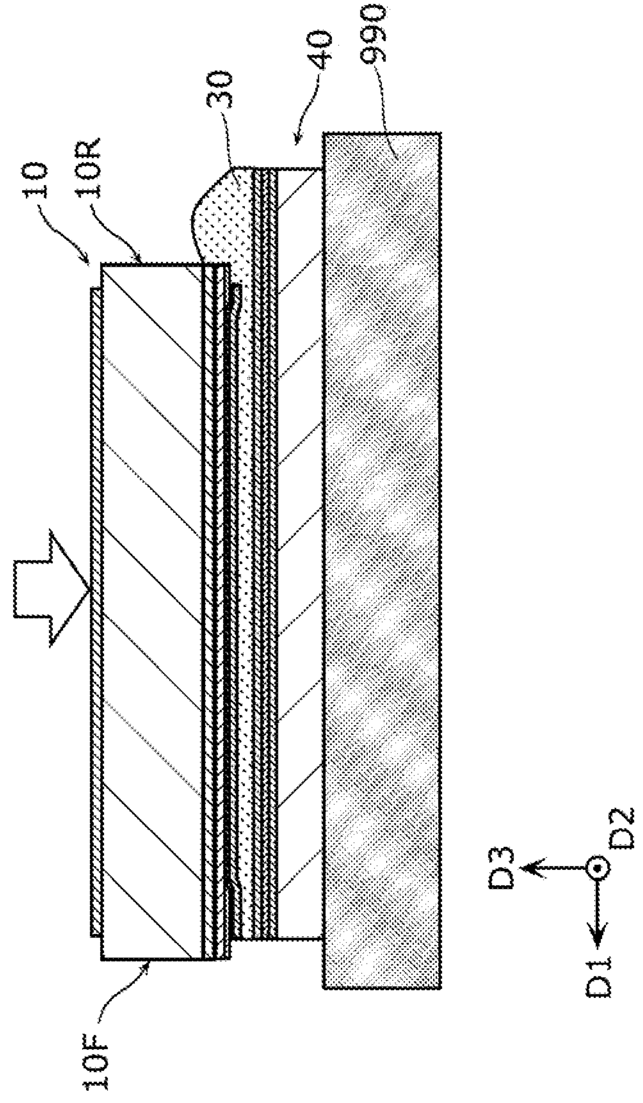
FIG. 7 is a schematic cross-sectional view illustrating the state after a first heating process in the method for manufacturing the semiconductor laser device according to Embodiment 1.
Figure 8:
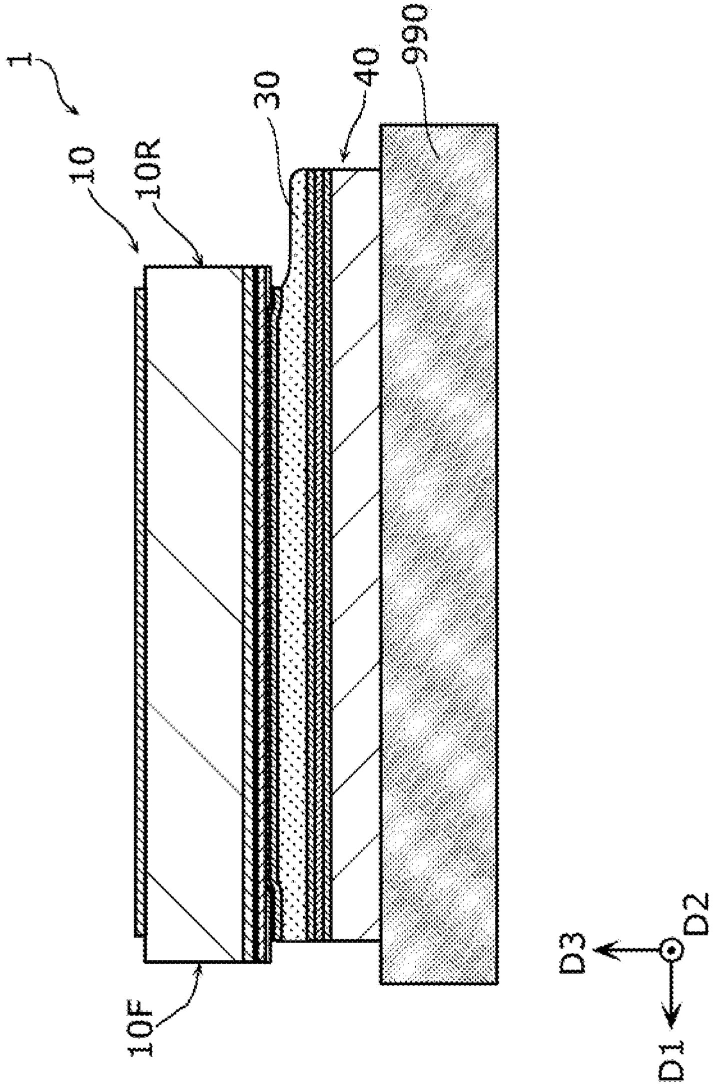
FIG. 8 is a schematic cross-sectional view illustrating the state after a second temperature lowering process in the method for manufacturing the semiconductor laser device according to Embodiment 1.

Next, a method for manufacturing semiconductor laser device 1 according to the present embodiment will be described with reference to FIG. 5 through FIG. 8. FIG. 5 is a flowchart of the method for manufacturing semiconductor laser device 1 according to the present embodiment. FIG. 6 through FIG. 8 are schematic cross-sectional views illustrating respective processes in the method for manufacturing semiconductor laser device 1 according to the present embodiment. FIG. 6 through FIG. 8 illustrate cross sections of semiconductor laser element 10, submount 40, and bonding material 30 taken perpendicular to second direction D2.

First, semiconductor laser element 10 is prepared as illustrated in FIG. 5 (S10).

Next, submount 40 on which bonding material 30 has been laminated above electrode film 43 is prepared (S20). In the present embodiment, bonding material 30 having thickness ts is laminated on barrier layer 44 of submount 40.

Next, as illustrated in FIG. 6, semiconductor laser element 10 is disposed on bonding material 30 (S30 in FIG. 5). Here, semiconductor laser element 10 is disposed on bonding material 30 with layered structure SL of semiconductor laser element 10 facing bonding material 30. At this time, front end surface 10F of semiconductor laser element 10 is located further outward than the outer edge portion of submount 40.

As illustrated in FIG. 5, after process S30 of disposing semiconductor laser element 10, submount 40 is heated to first peak temperature T1 higher than melting point Tm of bonding material 30 to melt bonding material 30 (first heating process S40). More specifically, as illustrated in FIG. 6, submount 40 is disposed on heater 990 and the temperature of heater 990 is increased to heat submount 40. In first heating process S40, before the temperature of submount 40 reaches melting point Tm of bonding material 30, semiconductor laser element 10 is pressed against submount 40 by starting to apply a load to semiconductor laser element 10, as illustrated in FIG. 7. This increases the surface area of contact between the surface of semiconductor laser element 10 facing bonding material 30 and bonding material 30, after bonding material 30 has melted. Stated differently, this makes it possible to inhibit the formation of voids between semiconductor laser element 10 and bonding material 30. As a result of applying a load to semiconductor laser element 10, bonding material 30 is pushed out from inner region 30M between semiconductor laser element 10 and submount 40 to outer regions 30B and 30C as well as the region outward of rear end surface 10R of semiconductor laser element 10. This increases the maximum thickness of bonding material 30 in, for example, outer regions 30B and 30C.

As illustrated in FIG. 5, after first heating process S40, the temperature of submount 40 is lowered to switching temperature Tv, which is below melting point Tm of bonding material 30 (first temperature lowering process S50). In first temperature lowering process S50, before the temperature of submount 40 reaches melting point Tm of bonding material 30, the application of load to semiconductor laser element 10 is stopped. The temperature at which the application of load is stopped does not necessarily need to be higher than melting point Tm, and may be lower than melting point Tm.

After first temperature lowering process S50, submount 40 is heated to second peak temperature T2, which is higher than melting point Tm of bonding material 30, to melt bonding material 30 again (second heating process S60). Here, first peak temperature T1, second peak temperature T2, and melting point Tm of bonding material 30 satisfy $Tm<T1<T2$.

After second heating process S60, the temperature of submount 40 is lowered to a temperature below melting point Tm of bonding material 30 (second temperature lowering process S70). Here, the temperature of submount 40 is lowered to the temperature before first heating process S40 is performed (i.e., the standby temperature).

In second heating process S60 and second temperature lowering process S70, a load may or may not be applied to semiconductor laser element 10. By not applying a load to semiconductor laser element 10, bonding material 30 pushed from inner region 30M between semiconductor laser element 10 and submount 40 to outer regions 30B and 30C, etc., can be moved to inner region 30M by surface tension. This reduces the maximum thickness of bonding material 30 in outer regions 30B and 30C.

Semiconductor laser device 1 like illustrated in FIG. 8 can be manufactured via the above processes.

Embodiment 2

Next, a semiconductor laser device according to Embodiment 2 will be described. The semiconductor laser device according to the present embodiment differs from semiconductor laser device 1 according to Embodiment 1 mainly in the shape of the bonding material. Hereinafter, the semiconductor laser device according to the present embodiment will be described with a focus the differences from semiconductor laser device 1 according to Embodiment 1.

2-1. Overall Configuration

Figure 9:
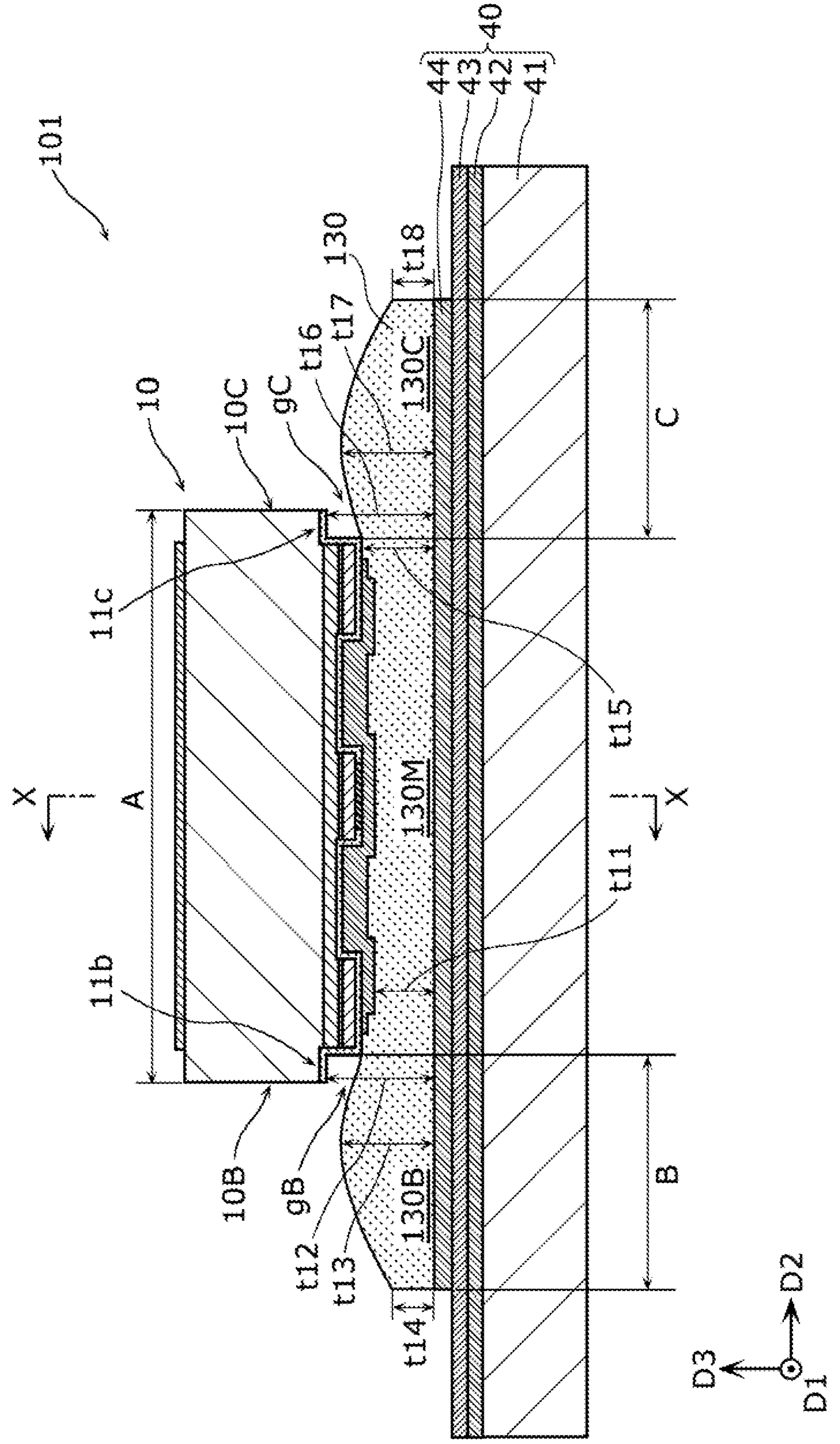
FIG. 9 is a schematic cross-sectional view illustrating a cross section of a semiconductor laser device according to Embodiment 2 taken perpendicular to the first direction.
Figure 10:
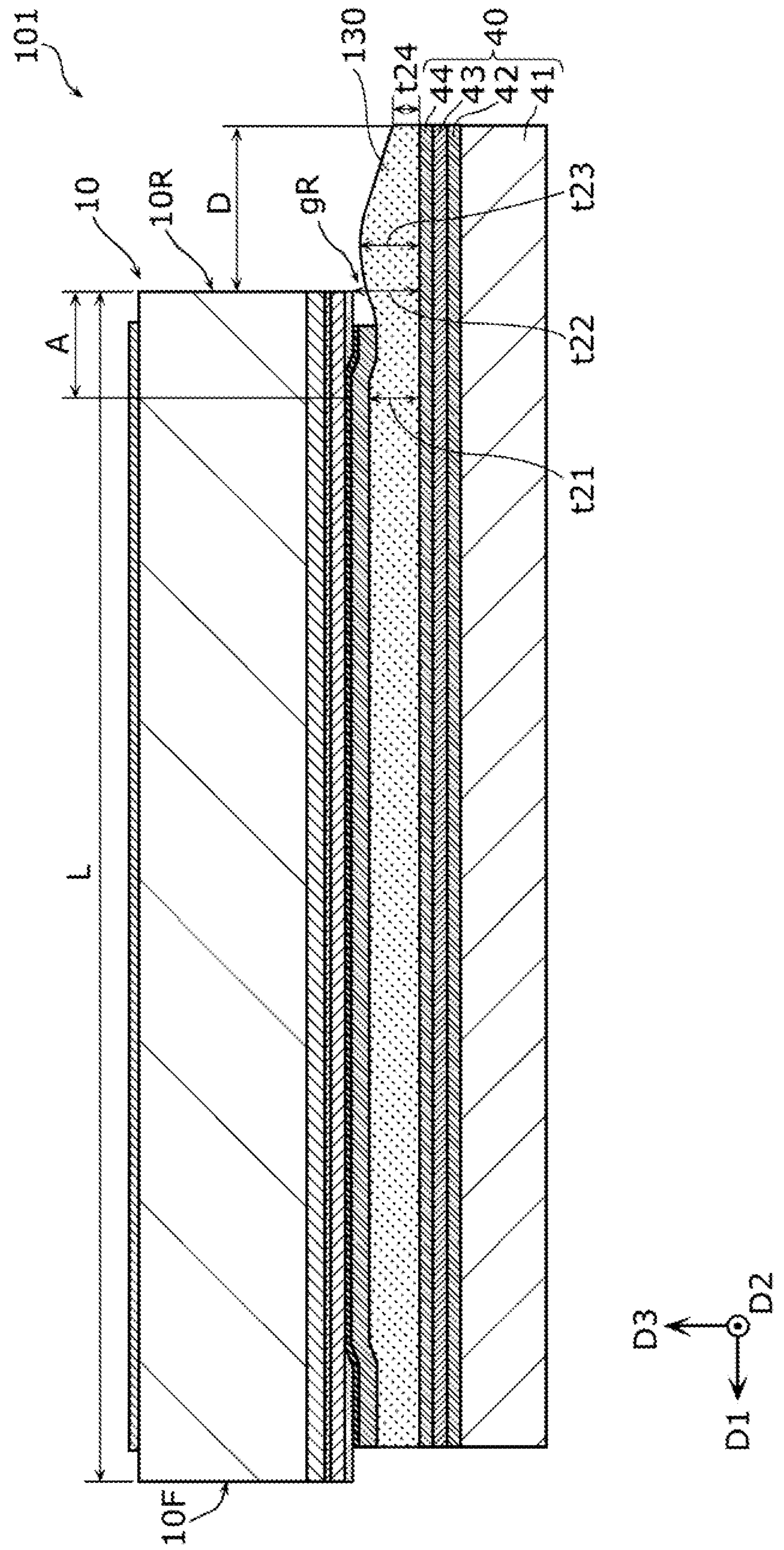
FIG. 10 is a schematic cross-sectional view illustrating a cross section of the semiconductor laser device according to Embodiment 2 taken perpendicular to the second direction.

First, the overall configuration of the semiconductor laser device according to the present embodiment will be described with reference to FIG. 9 and FIG. 10. FIG. 9 and FIG. 10 are schematic cross-sectional views illustrating cross sections of semiconductor laser device 101 according to the present embodiment taken perpendicular to first direction D1 and second direction D2. FIG. 10 illustrates a cross section taken at line X-X in FIG. 9.

As illustrated in FIG. 9 and FIG. 10, semiconductor laser device 101 includes submount 40, semiconductor laser element 10, and bonding material 130 that bonds submount 40 and semiconductor laser element 10. Semiconductor laser element 10 and submount 40 according to the present embodiment have same configuration as semiconductor laser element 10 and submount 40 according to Embodiment 1.

Bonding material 130 according to the present embodiment is a component that bonds submount 40 and semiconductor laser element 10 together. As illustrated in FIG. 9, in a cross section perpendicular to first direction D1, bonding material 130 includes inner region 130M bonded to semiconductor laser element 10, and among regions of bonding material 30 located outward of inner region 130M, one outer region 130B located on the side of inner region 130M that corresponds to the one side surface 10B of semiconductor laser element 10, and another outer region 130C located on the side of inner region 130M that corresponds to the other side surface 10C of semiconductor laser element 10. Stated differently, among regions of bonding material 30 located outward of inner region 130M, outer region 130B is the region on the side near side surface 10B of semiconductor laser element 10, and outer region 130C is the region on the side near side surface 10C of semiconductor laser element 10.

In the present embodiment, the surface of each outer region is convex. Bonding material 130 having such a shape can be realized, for example, by reducing the width of each outer region from that of semiconductor laser device 1 according to Embodiment 1, or by changing some aspect of the manufacturing method. For example, bonding material 130 according to the present embodiment can be realized by shortening the time of the second heating process or increasing the load applied to semiconductor laser element 10 compared to that of Embodiment 1. The configuration of bonding material 130 will be described in greater detail later.

2-2. Operation and Advantageous Effects

Next, the operation and advantageous effects of semiconductor laser device 101 according to the present embodiment will be described with reference to FIG. 9 and FIG. 10.

In semiconductor laser device 101 illustrated in FIG. 9, just as in semiconductor laser device 1 according to Embodiment 1, width A of semiconductor laser element 10, width B of the one outer region 130B, and width C of the other outer region 130C of bonding material 130 in second direction D2 satisfy B≥A/4 and C≥A/4. Just as in semiconductor laser device 1 according to Embodiment 1, this makes it possible to inhibit bonding material 130 from adhering to side surfaces 10B and 10C of semiconductor laser element 10, which in turn makes it possible to inhibit bonding material 130 from short circuiting p-type semiconductor layer 14 and n-type semiconductor layer 12.

Width A of semiconductor laser element 10, width B of the one outer region 130B, and width C of the other outer region 130C may satisfy at least one of B≥A/2 or C≥A/2.

Width A of semiconductor laser element 10, width B of the one outer region 130B, and width C of the other outer region 130C may satisfy B≤2A and C≤2A. Width A of semiconductor laser element 10, width B of the one outer region 130B, and width C of the other outer region 130C may satisfy B≤A and C≤A.

As described in Embodiment 1, at the one side surface 10B, semiconductor laser element 10 includes stepped portion 11*b* formed at the end portion closer to submount 40, and at the other side surface 10C, includes stepped portion 11*c* formed at the end portion closer to submount 40. As illustrated in FIG. 9, semiconductor laser element 10 is spaced apart from bonding material 130 at stepped portion 11*b* and stepped portion 11*c*. Stated differently, gap gB is formed between the one side surface 10B and the one outer region 130B of bonding material 130, and gap gC is formed between the other side surface 10C and the other outer region 130C of bonding material 130. This makes it possible to inhibit bonding material 130 from adhering to side surfaces 10B and 10C of semiconductor laser element 10.

Maximum thickness t13 of bonding material 130 in the one outer region 130B and distance t12 between stepped portion 11*b* and the surface of bonding material 130 that is on the submount 40 side (i.e., the distance between side surface 10B and submount 40) satisfy t13≤t12. Maximum thickness t17 of bonding material 130 in the other outer region 130C and distance t16 between stepped portion 11*c* and the surface of bonding material 130 that is on the submount 40 side (i.e., the distance between side surface 10C and submount 40) satisfy t17≤t16. This makes it possible to inhibit bonding material 130 from adhering to side surfaces 10B and 10C of semiconductor laser element 10.

Maximum thickness t15 of bonding material 130 in inner region 130M, minimum thickness t11 of bonding material 130 in inner region 130M, maximum thickness t13 of bonding material 130 in the one outer region 130B, and maximum thickness t17 of bonding material 130 in the other outer region 130C satisfy at least one of t13≤t11×4 or t17≤t15×4. This makes it possible to inhibit bonding material 130 from adhering to side surfaces 10B and 10C of semiconductor laser element 10 since the thickness of bonding material 130 at each of the outer regions can be reduced.

Maximum thickness t15, minimum thickness t11, maximum thickness t13, and maximum thickness t17 described above may satisfy at least one of t13≤t11×2 or t17≤t15×2. This makes it possible to inhibit bonding material 130 from adhering to side surfaces 10B and 10C of semiconductor laser element 10 since the thickness of bonding material 130 at each of the outer regions of bonding material 130 can be further reduced.

Semiconductor laser element 10 may be disposed at an angle to the main surface of submount 40. For example, bonding material 130 at inner region 130M of bonding material 130 may have a maximum thickness at a position closer to the other side surface 10C than to the one side surface 10B, and may have a minimum thickness at a position closer to the one side surface 10B than to the other side surface 10C. In such cases, maximum thickness t15 of bonding material 130 in inner region 130M, minimum thickness t11 of bonding material 130 in inner region 130M, thickness t14 of bonding material 130 at the outer edge portion of the one outer region 130B, and thickness t18 of bonding material 130 at the outer edge portion of the other outer region 130C may satisfy at least one of t11≥t14/1.5 or t15≥t18/1.5. This makes it possible to reduce the thickness of bonding material 130 in each outer region while ensuring sufficient thickness of bonding material 130 in inner region 130M. Therefore, bonding material 130 can be inhibited from adhering to each side surface of semiconductor laser element 10 while ensuring there is enough bonding surface area between semiconductor laser element 10 and bonding material 130.

As illustrated in FIG. 10, distance t22 between rear end surface 10R of semiconductor laser element 10 and the surface of bonding material 130 on the submount 40 side (i.e., the distance between rear end surface 10R and submount 40) and maximum thickness t23 of bonding material 130 located between rear end surface 10R and the outer edge portion of submount 40 satisfy t23≤t22. This makes it possible to inhibit bonding material 130 from adhering to rear end surface 10R of semiconductor laser element 10.

In first direction D1, maximum thickness t21 of bonding material 130 at a position inward of semiconductor laser element 10 from rear end surface 10R by a distance equal to width A of semiconductor laser element 10, and maximum thickness t23 of bonding material 130 located between rear end surface 10R and the outer edge portion of submount 40 satisfy t23≤t21×4. This makes it possible to reduce the thickness of bonding material 130 outward of rear end surface 10R of semiconductor laser element 10 while ensuring sufficient thickness of bonding material 130 between semiconductor laser element 10 and submount 40. Therefore, bonding material 130 can be inhibited from adhering to rear end surface 10R of semiconductor laser element 10 while ensuring there is enough bonding surface area between semiconductor laser element 10 and bonding material 130.

Maximum thickness t21 and maximum thickness t23 may satisfy t23≤t21×2. This makes it possible to further inhibit bonding material 130 from adhering to rear end surface 10R of semiconductor laser element 10.

In first direction D1, maximum thickness t21 of bonding material 130 at a position inward of semiconductor laser element 10 from rear end surface 10R by a distance equal to width A of semiconductor laser element 10, and thickness t24 of the outer edge portion of bonding material 130 located between rear end surface 10R and the outer edge portion of submount 40 satisfy t21≥t24/1.5. This makes it possible to inhibit bonding material 130 from adhering to rear end surface 10R of semiconductor laser element 10.

Embodiment 3

Next, a semiconductor laser device according to Embodiment 3 will be described. The semiconductor laser device according to the present embodiment differs from semiconductor laser device 1 according to Embodiment 1 mainly in that no stepped portion is formed in the semiconductor laser element. Hereinafter, the semiconductor laser device according to the present embodiment will be described with a focus the differences from semiconductor laser device 1 according to Embodiment 1 with reference to FIG. 11 and FIG. 12.

Figure 11:
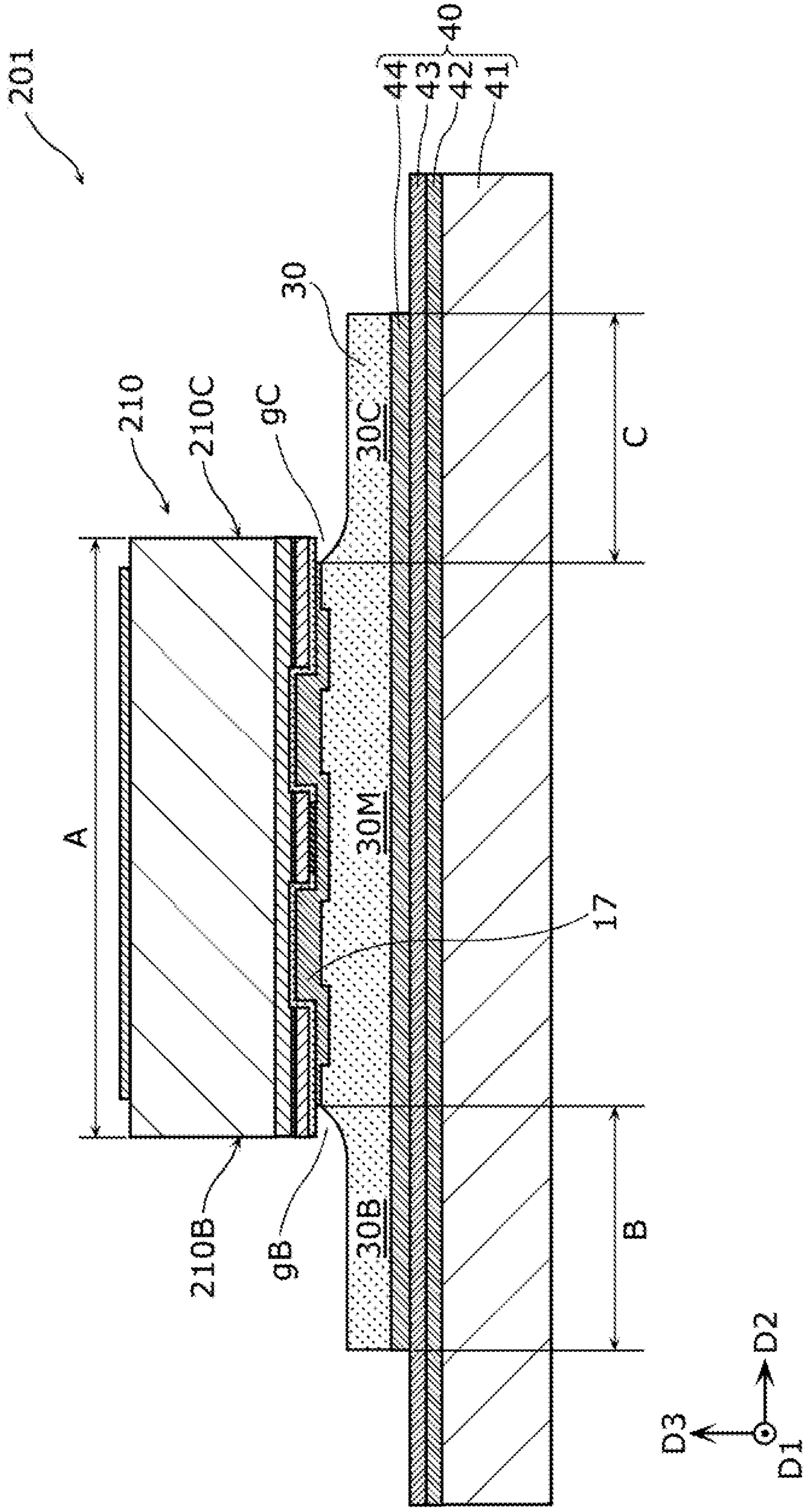
FIG. 11 is a schematic cross-sectional view illustrating a cross section of a semiconductor laser device according to Embodiment 3 taken perpendicular to the first direction.

FIG. 11 is a schematic cross-sectional view illustrating a cross section of semiconductor laser device 201 according to the present embodiment taken perpendicular to first direction D1. As illustrated in FIG. 11, semiconductor laser device 201 includes submount 40, semiconductor laser element 210, and bonding material 30 that bonds submount 40 and semiconductor laser element 210. Submount 40 and bonding material 30 according to the present embodiment have same configurations as submount 40 and bonding material 30 according to Embodiment 1.

Figure 12:
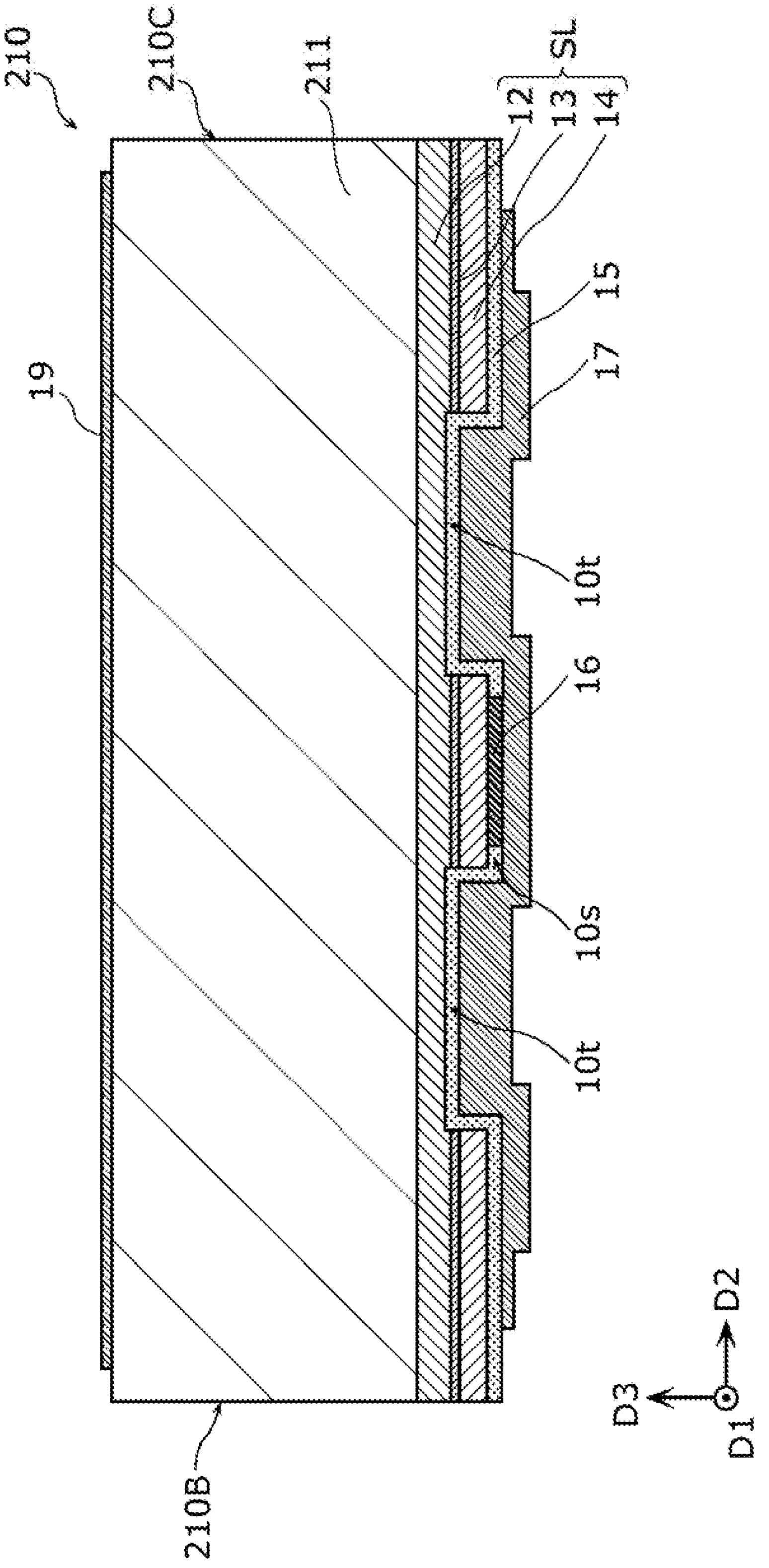
FIG. 12 is a schematic cross-sectional view of the overall configuration of a semiconductor laser element according to Embodiment 3.

Semiconductor laser element 210 according to the present embodiment will be described with reference to FIG. 12. FIG. 12 is a schematic cross-sectional view of the overall configuration of semiconductor laser element 210 according to the present embodiment. As illustrated in FIG. 12, semiconductor laser element 210 includes substrate 211, layered structure SL, insulating layer 15, p-side contact electrode 16, p-side electrode 17, and n-side electrode 19. Stepped portions 11*b* and 11*c* are not formed in semiconductor laser element 210 according to the present embodiment. Accordingly, the shape of substrate 211, etc., differs from that of substrate 11, etc., according to Embodiment 1.

In semiconductor laser device 201 including semiconductor laser element 210 having such a configuration, just as in semiconductor laser device 1 according to Embodiment 1, bonding material 30 can be inhibited from adhering to the one side surface 210B, the other side surface 210C, and the rear end surface (not illustrated in FIG. 11 or FIG. 12) of semiconductor laser element 210. More specifically, p-side electrode 17 of semiconductor laser element 210 is not formed on each side surface, as illustrated in FIG. 11 and FIG. 12. P-side electrode 17 configured in this way is bonded to bonding material 30. Note that in the present embodiment, bonding material 30 is not bonded to insulating layer 15 of semiconductor laser element 10. With this, as illustrated in FIG. 11, bonding material 30 includes inner region 30M bonded to p-side electrode 17 of semiconductor laser element 210, and among regions of bonding material 30 located outward of inner region 30M, one outer region 30B located on the side of inner region 30M that corresponds to the one side surface 210B of semiconductor laser element 210, and another outer region 30C located on the side of inner region 30M that corresponds to the other side surface 210C of semiconductor laser element 210.

Thus, as illustrated in FIG. 11, outer region 30B of bonding material 30 can be spaced apart from the one side surface 210B of semiconductor laser element 210. Stated differently, gap gB is formed between the one side surface 210B and outer region 30B of bonding material 30. Outer region 30C of bonding material 30 can be spaced apart from the other side surface 210C of semiconductor laser element 210. Stated differently, gap gC is formed between the other side surface 210C and outer region 30C of bonding material 30.

In this way, it is possible to realize semiconductor laser device 201 that can inhibit bonding material 30 from adhering to each side surface and the rear end surface of semiconductor laser element 210, even when semiconductor laser element 210 with no stepped portions is used.

Variations, etc.

Hereinbefore, the semiconductor laser device according to the present disclosure has been described based on embodiments, but the present disclosure is not limited to the above embodiments.

For example, in each of the above embodiments, the semiconductor laser element is exemplified as an element including a nitride semiconductor material, but the semiconductor laser element is not limited to this example. For example, the semiconductor laser element may be an element including a GaAs-based material. In such cases, resonator length L may be approximately 4 mm and width A may be approximately 0.5 mm.

In each of the above embodiments of semiconductor laser element 10, the waveguide is exemplified as being formed by ridge portions 10*s*, but the configuration of the waveguide is not limited to this example. For example, the waveguide may be formed using electrode stripe structures or embedded structures or the like.

Various modifications of the above embodiments that may be conceived by those skilled in the art, as well as embodiments resulting from arbitrary combinations of elements and functions from different embodiments that do not depart from the essence of the present disclosure are included the present disclosure.

INDUSTRIAL APPLICABILITY

The semiconductor laser device according the present disclosure is applicable to, for example, laser processing machines, projectors, and automotive headlamps, as a high-power and high-efficiency light source.

The invention claimed is:

1. A semiconductor laser device comprising:
- a submount;
- a semiconductor laser element; and
- a bonding material that bonds the submount and the semiconductor laser element, wherein
- the semiconductor laser element includes a substrate and a layered structure laminated above a main surface of the substrate, and is disposed with the layered structure facing the submount,
- the layered structure includes a first conductive semiconductor layer, an active layer, and a second conductive semiconductor layer laminated in stated order on the substrate,
- a waveguide extending in a first direction parallel to the main surface of the substrate is formed in the layered structure,
- in a cross section perpendicular to the first direction, the bonding material includes:
  - an inner region bonded to the semiconductor laser element; and
  - among regions located outward of the inner region, one outer region located on a side of the inner region that corresponds to one side surface of the semiconductor laser element and an other outer region located on a side of the inner region that corresponds to an other side surface of the semiconductor laser element,
- the one outer region includes a region located outward of the one side surface,
- the other outer region includes a region located outward of the other side surface,
- the one outer region is spaced apart from a point on an end of the semiconductor laser element, the end being in a second direction, the point being located on a line extending in the second direction and passing through a point, on the layered structure, that is closest to the submount, the second direction being perpendicular to the first direction and parallel to the main surface of the substrate, and a width A of the semiconductor laser element, a width B of the one outer region, and a width C of the other outer region in the second direction satisfy B≥A/4 and C≥A/4.

2. The semiconductor laser device according to claim 1, wherein the bonding material has an average thickness of less than 3.5 μm.

3. The semiconductor laser device according to claim 1, wherein the bonding material in the inner region has a maximum thickness at a position closer to the other side surface than to the one side surface, and a maximum thickness t3 of the inner region and a thickness t4 of a flat portion of the bonding material in the other outer region satisfy t4≤t3.

4. The semiconductor laser device according to claim 1, wherein the bonding material in the inner region has a minimum thickness at a position closer to the one side surface than to the other side surface, and a minimum thickness t1 of the bonding material in the inner region and a thickness t2 of a flat portion of the bonding material in the one outer region satisfy t2≤t1.

5. The semiconductor laser device according to claim 1, wherein on at least one of the one outer region or the other outer region, a surface of a portion located between the semiconductor laser element and the submount is a recessed surface or a flat surface.

6. The semiconductor laser device according to claim 1, wherein at at least one of the one side surface or the other side surface, the semiconductor laser element includes a stepped portion formed at an end portion closer to the submount, and the semiconductor laser element and the bonding material are spaced apart at the stepped portion.

7. The semiconductor laser device according to claim 1, wherein at the one side surface, the semiconductor laser element includes a first stepped portion formed at an end portion closer to the submount, and at the other side surface, includes a second stepped portion formed at an end portion closer to the submount, the semiconductor laser element and the bonding material are spaced apart at the first stepped portion and the second stepped portion, a maximum thickness t13 of the bonding material in the one outer region and a distance t12 between the first stepped portion and a surface of the bonding material that faces the submount satisfy t13≤t12, and a maximum thickness t17 of the bonding material in the other outer region and a distance t16 between the second stepped portion and a surface of the bonding material that faces the submount satisfy t17≤t16.

8. The semiconductor laser device according to claim 7, wherein a maximum thickness t15 of the bonding material in the inner region, the maximum t11 of the bonding material in the inner region, the maximum thickness t13 of the bonding material in the one outer region, and the maximum thickness t17 of the bonding material in the other outer region satisfy at least one of t13≤t11×4 or t17≤t15×4.

9. The semiconductor laser device according to claim 8, wherein the maximum thickness t15 of the bonding material in the inner region, the minimum thickness t11 of the bonding material in the inner region, the maximum thickness t13 of the bonding material in the one outer region, and the maximum thickness t17 of the bonding material in the other outer region satisfy at least one of t13≤t11×2 or t17≤t15×2.

10. The semiconductor laser device according to claim 1, wherein at the one side surface, the semiconductor laser element includes a first stepped portion formed at an end portion closer to the submount, and at the other side surface, includes a second stepped portion formed at an end portion closer to the submount, the semiconductor laser element and the bonding material are spaced apart at the first stepped portion and the second stepped portion, the bonding material in the inner region has a maximum thickness at a position closer to the other side surface than to the one side surface and a minimum thickness at a position closer to the one side surface than to the other side surface, and a maximum thickness t15 of the bonding material in the inner region, a minimum thickness t11 of the bonding material in the inner region, a thickness t14 of the bonding material at an outer edge portion of the one outer region, and a thickness t18 of the bonding material at an outer edge portion of the other outer region satisfy at least one of t11≥t14/1.5 or t15≥t18/1.5.

11. The semiconductor laser device according to claim 1, wherein the semiconductor laser element includes an insulating layer disposed between the layered structure and the bonding material, and the insulating layer is spaced apart from the bonding material at both end portions in the second direction of the semiconductor laser element.

12. The semiconductor laser device according to claim 1, wherein the semiconductor laser element includes a front end surface that emits laser light in the first direction and a rear end surface on an opposite side relative to the front end surface, and the front end surface is located outward of the submount from an outer edge portion of the submount in the first direction.

13. The semiconductor laser device according to claim 12, wherein the rear end surface is located inward of the submount from an outer edge portion of the submount in the first direction, the bonding material is present between the rear end surface and the outer edge portion of the submount, and the bonding material is spaced apart from the rear end surface.

14. The semiconductor laser device according to claim 13, wherein a thickness t5 at a flat portion of the bonding material located between the rear end surface and the outer edge portion of the submount, and a thickness t6 of the bonding material at a position inward of the semiconductor laser element from the rear end surface by a distance equal to the width A of the semiconductor laser element satisfy t5≤t6.

15. The semiconductor laser device according to claim 13, wherein a distance t22 between the rear end surface and a surface of the bonding material that faces the submount and a maximum thickness t23 of the bonding material located between the rear end surface and the outer edge portion of the submount satisfy t23≤t22.

16. The semiconductor laser device according to claim 15, wherein in the first direction, a maximum thickness t21 of the bonding material at a position inward of the semiconductor laser element from the rear end surface by a distance equal to the width A of the semiconductor laser element, and a maximum thickness t23 of the bonding material located between the rear end surface and the outer edge portion of the submount satisfy t23≤t21×4.

17. The semiconductor laser device according to claim 16, wherein in the first direction, the maximum thickness t21 of the bonding material at a position inward of the semiconductor laser element from the rear end surface by a distance equal to the width A of the semiconductor laser element, and the maximum thickness t23 of the bonding material located between the rear end surface and the outer edge portion of the submount satisfy t23≤t21×2.

18. The semiconductor laser device according to claim 15, wherein in the first direction, the maximum thickness t21 of the bonding material at a position inward of the semiconductor laser element from the rear end surface by a distance equal to the width A of the semiconductor laser element, and a thickness t24 of an outer edge portion of the bonding material located between the rear end surface and the outer edge portion of the submount satisfy t21≥t24/1.5.

19. The semiconductor laser device according to claim 15, wherein a distance D, in the first direction, between the rear end surface and an outer edge portion of the bonding material located between the rear end surface and the outer edge portion of the submount, and the width A of the semiconductor laser element satisfy D≥A/4.

20. The semiconductor laser device according to claim 19, wherein the distance D, in the first direction, between the rear end surface and the outer edge portion of the bonding material located between the rear end surface and the outer edge portion of the submount, and the width A of the semiconductor laser element satisfy D≥A/2.

21. A semiconductor laser device comprising:

a submount;

a semiconductor laser element; and a bonding material that bonds the submount and the semiconductor laser element, wherein the semiconductor laser element includes a substrate and a layered structure laminated above a main surface of the substrate, and is disposed with the layered structure facing the submount, the layered structure includes a first conductive semiconductor layer, an active layer, and a second conductive semiconductor layer laminated in stated order on the substrate, a waveguide extending in a first direction parallel to the main surface of the substrate is formed in the layered structure, in a cross section perpendicular to the first direction, the bonding material includes:

an inner region bonded to the semiconductor laser element; and among regions located outward of the inner region, one outer region located on a side of the inner region that corresponds to one side surface of the semiconductor laser element and an other outer region located on a side of the inner region that corresponds to an other side surface of the semiconductor laser element, the one outer region includes a region located outward of the one side surface, the other outer region includes a region located outward of the other side surface, the one outer region is spaced apart from a point on an end of the semiconductor laser element, the end being in a second direction, the point being located on a line extending in the second direction and passing through a point, on the layered structure, that is closest to the submount the second direction being perpendicular to the first direction and parallel to the main surface of the substrate, at the one side surface, the semiconductor laser element includes a first stepped portion formed at an end portion closer to the submount, and at the other side surface, includes a second stepped portion formed at an end portion closer to the submount, the semiconductor laser element and the bonding material are spaced apart at the first stepped portion and the second stepped portion, a maximum thickness t13 of the bonding material in the one outer region and a distance t12 between the first stepped portion and a surface of the bonding material that faces the submount satisfy t13≤t12, and a maximum thickness t17 of the bonding material in the other outer region and a distance t16 between the second stepped portion and a surface of the bonding material that faces the submount satisfy t17≤t16.

22. A semiconductor laser device comprising:

a submount;

a semiconductor laser element; and a bonding material that bonds the submount and the semiconductor laser element, wherein the semiconductor laser element includes a substrate and a layered structure laminated above a main surface of the substrate, and is disposed with the layered structure facing the submount, the layered structure includes a first conductive semiconductor layer, an active layer, and a second conductive semiconductor layer laminated in stated order on the substrate, a waveguide extending in a first direction parallel to the main surface of the substrate is formed in the layered structure, in a cross section perpendicular to the first direction, the bonding material includes:

an inner region bonded to the semiconductor laser element; and among regions located outward of the inner region, one outer region located on a side of the inner region that corresponds to one side surface of the semiconductor laser element and an other outer region located on a side of the inner region that corresponds to an other side surface of the semiconductor laser element, the one outer region includes a region located outward of the one side surface, the other outer region includes a region located outward of the other side surface, the one outer region is spaced apart from a point on an end of the semiconductor laser element, the end being in a second direction, the point being located on a line extending in the second direction and passing through a point, on the layered structure, that is closest to the submount, the second direction being perpendicular to the first direction and parallel to the main surface of the substrate, at the one side surface, the semiconductor laser element includes a first stepped portion formed at an end portion closer to the submount, and at the other side surface, includes a second stepped portion formed at an end portion closer to the submount, the semiconductor laser element and the bonding material are spaced apart at the first stepped portion and the second stepped portion, the bonding material in the inner region has a maximum thickness at a position closer to the other side surface than to the one side surface and a minimum thickness at a position closer to the one side surface than to the other side surface, and a maximum thickness t15 of the bonding material in the inner region, a minimum thickness t11 of the bonding material in the inner region, a thickness t14 of the bonding material at an outer edge portion of the one outer region, and a thickness t18 of the bonding material at an outer edge portion of the other outer region satisfy at least one of $t11 \geq t14/1.5$ or $t15 \geq t18/1.5$.

23. A semiconductor laser device comprising:

a submount;

a semiconductor laser element; and a bonding material that bonds the submount and the semiconductor laser element, wherein the semiconductor laser element includes a substrate and a layered structure laminated above a main surface of the substrate, and is disposed with the layered structure facing the submount, the layered structure includes a first conductive semiconductor layer, an active layer, and a second conductive semiconductor layer laminated in stated order on the substrate, a waveguide extending in a first direction parallel to the main surface of the substrate is formed in the layered structure, in a cross section perpendicular to the first direction, the bonding material includes:

an inner region bonded to the semiconductor laser element; and among regions located outward of the inner region, one outer region located on a side of the inner region that corresponds to one side surface of the semiconductor laser element and an other outer region located on a side of the inner region that corresponds to an other side surface of the semiconductor laser element, the one outer region includes a region located outward of the one side surface, the other outer region includes a region located outward of the other side surface, the one outer region is spaced apart from a point on an end of the semiconductor laser element, the end being in a second direction, the point being located on a line extending in the second direction and passing through a point, on the layered structure, that is closest to the submount, the second direction being perpendicular to the first direction and parallel to the main surface of the substrate, the semiconductor laser element includes a front end surface that emits laser light in the first direction and a rear end surface on an opposite side relative to the front end surface, the front end surface is located outward of the submount from an outer edge portion of the submount in the first direction, the rear end surface is located inward of the submount from the outer edge portion of the submount in the first direction, the bonding material is present between the rear end surface and the outer edge portion of the submount, and the bonding material is spaced apart from the rear end surface.

* * * * *